(12) United States Patent
Sato et al.

(10) Patent No.: US 11,367,749 B2
(45) Date of Patent: Jun. 21, 2022

(54) SPIN ORBIT TORQUE (SOT) MEMORY DEVICES AND THEIR METHODS OF FABRICATION

(71) Applicant: Intel Corporation, Santa Clara, CA (US)

(72) Inventors: Noriyuki Sato, Hillsboro, OR (US); Angeline Smith, Hillsboro, OR (US); Tanay Gosavi, Hillsboro, OR (US); Sasikanth Manipatruni, Portland, OR (US); Kaan Oguz, Portland, OR (US); Kevin O'Brien, Portland, OR (US); Tofizur Rahman, Portland, OR (US); Gary Allen, Portland, OR (US); Atm G. Sarwar, North Plains, OR (US); Ian Young, Portland, OR (US); Hui Jae Yoo, Hillsboro, OR (US); Christopher Wiegand, Portland, OR (US); Benjamin Buford, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 658 days.

(21) Appl. No.: 16/022,564

(22) Filed: Jun. 28, 2018

(65) Prior Publication Data
US 2020/0006424 A1  Jan. 2, 2020

(51) Int. Cl.
| H01L 43/02 | (2006.01) |
| H01L 27/22 | (2006.01) |
| G11C 11/16 | (2006.01) |
| H01F 10/32 | (2006.01) |
| H01L 43/12 | (2006.01) |
| H01F 41/34 | (2006.01) |

(52) U.S. Cl.
CPC .......... *H01L 27/228* (2013.01); *G11C 11/161* (2013.01); *G11C 11/1673* (2013.01); *H01F 10/329* (2013.01); *H01F 10/3254* (2013.01); *H01F 10/3272* (2013.01); *H01F 10/3286* (2013.01); *H01F 41/34* (2013.01); *H01L 43/02* (2013.01); *H01L 43/12* (2013.01)

(58) Field of Classification Search
CPC ....... H01L 27/228; H01L 43/02; H01L 43/12; G11C 11/161; G11C 11/1673; H01F 10/3254; H01F 10/3272; H01F 10/3286; H01F 10/329; H01F 41/34
USPC .......................................................... 257/427
See application file for complete search history.

(56) References Cited

U.S. PATENT DOCUMENTS

| 9,251,883 | B2* | 2/2016 | Wu | ..................... G11C 11/1693 |
| 10,276,784 | B1* | 4/2019 | Yu | ........................... H01L 43/12 |
| 2009/0166773 | A1* | 7/2009 | Ohno | ................... G11C 11/161 |
| | | | | 257/421 |

(Continued)

*Primary Examiner* — Jami Valentine Miller
(74) *Attorney, Agent, or Firm* — Essential Patents Group, LLP

(57) ABSTRACT

A spin orbit torque (SOT) memory device includes a magnetic tunnel junction (MTJ) device with one end coupled with a first electrode and an opposite end coupled with a second electrode including a spin orbit torque material. In an embodiment, a second electrode is coupled with the free magnet and coupled between a pair of interconnect line segments. The second electrode and the pair of interconnect line segments include a spin orbit torque material. The second electrode has a conductive path cross-section that is smaller than a cross section of the conductive path in at least one of the interconnect line segments.

14 Claims, 16 Drawing Sheets

(56) References Cited

U.S. PATENT DOCUMENTS

| | | | |
|---|---|---|---|
| 2014/0056060 A1* | 2/2014 | Khvalkovskiy | H01L 43/02 365/158 |
| 2016/0079518 A1* | 3/2016 | Pi | G11C 11/1675 257/421 |
| 2016/0225423 A1* | 8/2016 | Naik | H01L 27/228 |
| 2018/0374526 A1* | 12/2018 | Lee | H01L 43/02 |
| 2019/0131518 A1* | 5/2019 | Yu | G11C 11/161 |
| 2019/0287589 A1* | 9/2019 | Buyandalai | H01L 27/228 |
| 2019/0304653 A1* | 10/2019 | Oguz | H01F 10/3254 |
| 2020/0273864 A1 | 8/2020 | Manipatruni et al. | |
| 2020/0273866 A1 | 8/2020 | Manipatruni et al. | |
| 2020/0273867 A1 | 8/2020 | Manipatruni et al. | |
| 2020/0303343 A1 | 9/2020 | Manipatruni et al. | |
| 2020/0303344 A1 | 9/2020 | Manipatruni et al. | |
| 2020/0321344 A1 | 10/2020 | Ramamoorthy et al. | |
| 2020/0321472 A1 | 10/2020 | Ramamoorthy et al. | |
| 2020/0321473 A1 | 10/2020 | Ramamoorthy et al. | |
| 2020/0321474 A1 | 10/2020 | Ramamoorthy et al. | |
| 2021/0202507 A1 | 7/2021 | Thareja et al. | |
| 2021/0202510 A1 | 7/2021 | Thareja et al. | |
| 2021/0202689 A1 | 7/2021 | Thareja et al. | |
| 2021/0202690 A1 | 7/2021 | Thareja et al. | |
| 2021/0203324 A1 | 7/2021 | Manipatruni et al. | |
| 2021/0203325 A1 | 7/2021 | Manipatruni et al. | |
| 2021/0203326 A1 | 7/2021 | Manipatruni et al. | |
| 2021/0226636 A1 | 7/2021 | Manipatruni et al. | |

\* cited by examiner and smaller features enables increased densities of functional units on the limited real estate of semiconductor chips. For example, shrinking transistor size allows for the incorporation of an increased number of memory devices on a chip, lending to the fabrication of products with increased functionality. The drive for ever-more functionality, however, is not without issue. It has become increasingly significant to rely on innovative devices such as spin orbit torque (SOT) memory devices including a spin orbit torque electrode coupled with a compatible MTJ device to overcome the requirements imposed by scaling.

SPIN ORBIT TORQUE (SOT) MEMORY DEVICES AND THEIR METHODS OF FABRICATION

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased functionality. The drive for ever-more functionality, however, is not without issue. It has become increasingly significant to rely on innovative devices such as spin orbit torque (SOT) memory devices including a spin orbit torque electrode coupled with a compatible MTJ device to overcome the requirements imposed by scaling.

Non-volatile embedded memory with SOT memory devices, e.g., on-chip embedded memory with non-volatility can enable energy and computational efficiency. However, the technical challenges of assembling a material layer stack to form functional SOT memory devices present formidable roadblocks to commercialization of this technology today. Specifically, decreasing switching current while preserving endurance in SOT memory devices are some important areas of device development.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

DESCRIPTION OF THE EMBODIMENTS

Figure 1A:
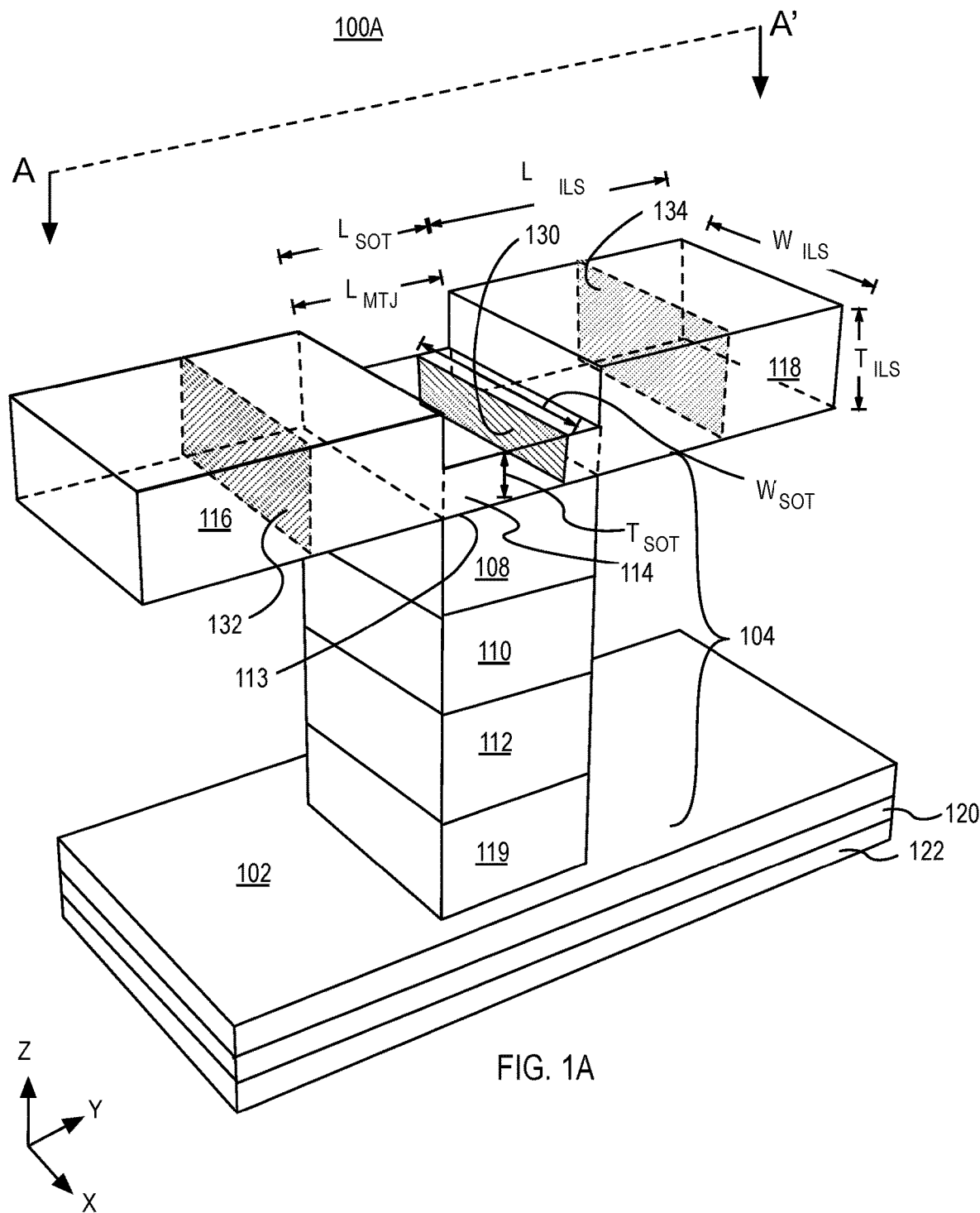
FIG. 1A illustrates an isometric view of a spin orbit torque (SOT) memory device, in accordance with embodiments of the present disclosure.

Spin orbit torque (SOT) memory devices with reduced switching current and their methods of fabrication are described. In the following description, numerous specific details are set forth, such as novel structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations and switching operations associated with embedded memory, are described in lesser detail in order to not unnecessarily obscure embodiments of the present disclosure. Furthermore, it is to be understood that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous details are set forth. However, it will be apparent to one skilled in the art, that the present disclosure may be practiced without these specific details. In some instances, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

As used throughout this description, and in the claims, a list of items joined by the term "at least one of" or "one or more of" can mean any combination of the listed terms.

An SOT memory device may include a magnetic tunnel junction (MTJ) device coupled with a spin orbit torque electrode. The MTJ device functions as a memory device where the resistance of the MTJ device switches between a high resistance state and a low resistance state. The resistance state of an MTJ device is defined by the relative orientation of magnetization between a free magnet and a fixed magnet that is separated from the free magnet by a tunnel barrier. When the magnetization of the free magnet and a fixed magnet have orientations that are in the same direction, the MTJ device is said to be in a low resistance state. Conversely, when the magnetization of the free magnet and the magnetization of the fixed magnet are oriented in an opposite direction to each other, the MTJ device is said to be in a high resistance state.

In an embodiment, in an absence of a spin orbit torque electrode, resistance switching in an MTJ device is brought about by passing a critical amount of spin polarized current through the MTJ device so as to influence the orientation of the magnetization of the free magnet to align with the magnetization of the fixed magnet. The act of influencing the magnetization is brought about by a phenomenon known as spin torque transfer, where the torque from the spin polarized current is imparted to the magnetization of the free magnet. By changing the direction of the spin polarized current, the direction of magnetization in the free magnet may be reversed relative to the direction of magnetization in the fixed magnet. Since the free magnet does not need a constant source of spin polarized current to maintain a magnetization direction, the resistance state of the MTJ device is retained even when no current flows through the MTJ device. For this reason, the MTJ device belongs to a class of memory known as non-volatile memory.

As an MTJ device is scaled down in size, the amount of critical spin polarized current density required to switch the device increases. By implementing an MTJ device on an SOT electrode, the magnetization in the free magnet may undergo torque assisted switching from a Spin Hall current, induced by passing an electrical current through the SOT electrode in a direction transverse to a thickness of the MTJ device material stack. The Spin Hall current arises from spin dependent scattering of electrons due to a phenomenon known as spin orbit interaction. Electrons of one spin polarity are directed towards an upper portion of the spin orbit torque electrode and electrons with an opposite spin polarity are directed toward a bottom portion of the spin orbit torque electrode. Electrons of a particular spin polarity are directed toward the MTJ device and impart a spin orbit torque on the magnetization of the free magnet. The spin hall current may also help the MTJ device switch faster. It is to be appreciated that, in an embodiment, the spin hall current can fully switch a free magnet having an in-plane magnetization, even in the absence of a spin polarized current passing through the MTJ device. An in-plane direction is defined as a direction that is parallel to an uppermost surface of the spin orbit torque electrode. An external field may be utilized to help break the symmetry required to exert a torque to completely switch the free magnet.

Integrating a non-volatile memory device such as an SOT memory device onto access transistors enables the formation of embedded memory for system on chip (SOC) applications. However, approaches to integrate an SOT memory device onto access transistors presents challenges that have become far more formidable with scaling. One such challenge is the need to reduce critical switching current of the MTJ memory device coupled with transistors. As transistors are scaled in size the total drive current generated may also become smaller resulting in a lower amount of current available to switch an MTJ memory device. However, a lowered switching current may still be utilized to switch an MTJ memory device if a thermal barrier of the MTJ device can be lowered during operation. A thermal barrier is important for MTJ memory device operation to prevent accidental flipping of the memory states. MTJ memory devices are often designed to have a thermal barrier of at least 40 KT to provide stability against errant switching. The thermal barrier may be reduced, in a controllable manner, by implementing a spin-orbit torque heater adjacent to the MTJ memory device. During operation, ohmic heating generated in the SOT electrode in the vicinity of the MTJ device may reduce the thermal barrier and the critical current requirement.

In accordance with embodiments of the present disclosure, a spin orbit torque (SOT) memory device includes a magnetic tunnel junction (MTJ) device with one end coupled with a first electrode and an opposite end coupled with a second electrode including a spin orbit torque material. In an embodiment, a second electrode is coupled with the free magnet and coupled between a pair of interconnect line segments. The second electrode and the pair of interconnect line segments include a spin orbit torque material. The second electrode has a cross-section of a conductive path that is smaller than a cross section of a conductive path in at least one of the interconnect line segments. For instance, when a voltage is applied between the pair of interconnect line segments current flows in a direction transverse to the cross section of the interconnect line segments and transverse to the cross section of the second electrode. A smaller cross-sectional area of the conductive path in the second electrode (compared to the cross-sectional area of the conductive path in the interconnect line segment) may cause ohmic heating in the second electrode. The heat may then dissipate into the MTJ memory device in contact with the second electrode. In some embodiments, heating of the MTJ memory device may induce lowering of the natural thermal barrier of the MTJ memory device.

As MTJ devices (formed on spin orbit torque electrode) are scaled, the need for smaller memory cell size has driven the industry in the direction of perpendicular MTJs. Perpendicular MTJs are memory devices where the fixed magnet and the free magnet have magnetic anisotropy that is perpendicular with respect to a plane defining an uppermost surface of the spin orbit torque electrode. Implementing a perpendicular MTJ with an SOT heater having one or more of the features described herein may reduce critical current to switch the MTJ.

FIG. 1A is an illustration of an isometric view of an SOT memory device 100A in accordance with an embodiment of the present disclosure. The SOT memory device 100A includes a magnetic tunnel junction (MTJ) device 104 coupled with a first electrode 102, where the MTJ device includes a free magnet 108, a tunnel barrier 110 and a fixed magnet 112. In the illustrative embodiment, the magnetic tunnel junction (MTJ) device 104 is a perpendicular MTJ (pMTJ) device 104. An SOT memory device 100A that includes a pMTJ device 104, is herein referred to as a perpendicular SOT (pSOT) memory device 100A. A second electrode 114 is coupled with the free magnet 108 and coupled between a pair of interconnect line segments 116 and 118. The electrode 114 and the interconnect line segments 116 and 118 include a spin orbit torque material. The electrode 114 has of a conductive path with a cross-section 130 that is smaller than a cross section 132 of a conductive path in at least one of the interconnect line segments 116 or 118.

In the illustrative embodiment, the conductive path has a smaller cross-section 130 than a cross section 132 or cross section 134 within either of the interconnect line segments 116 or 118, respectively. The cross section 130 is an area defined by the product of a width $W_{SOT}$ along a first direction and a thickness $T_{SOT}$ of the electrode 114 along a second direction, orthogonal to the first direction. Similarly, cross section 134 is an area defined by the product of a width $W_{ILS}$ (along the first direction) and thickness $T_{ILS}$ of the electrode 114 along the second direction, as shown in FIG. 1A. In the illustrative embodiment, the cross section 132 has an area that is substantially similar in magnitude to the cross section 134. In an embodiment, a reduced area in cross-section 130 in the electrode 114 compared to an area in cross sections 132, 134 in the interconnect line segment 116 or 118, respectively causes a constriction in current flowing between the interconnect line segment 116 or 118 into the electrode 114. In some such embodiments, such a constriction may cause joule heating in the electrode 114 due to an increase in electrical resistance caused by the constriction. The joule heating may enable a reduction in the thermal barrier at interface 113 between the free layer 108 and the electrode 114.

In an embodiment, the electrode 114 includes the thickness, $T_{SOT}$, of the spin orbit coupling (SOC) material, and at least one of the interconnect line segments 116 or 118 includes a second thickness of the SOC material. In the illustrative embodiment, the electrode 114 has a thickness, $T_{SOT}$ that is less than a thickness, $T_{ILS}$ of the SOC material of each of the interconnect line segments 116 or 118. As further illustrated, the interconnect line segments 116 and 118 both have a substantially similar thickness, $T_{ILS}$. In some embodiments, $T_{SOT}$ is between 2 nm and 4 nm. In some embodiments, $T_{ILS}$ is between 10 nm and 20 nm.

In an embodiment, at least one of the interconnect line segments 116 or 118 has a width that is the same, or substantially the same (e.g., within 10% of one or the other), as the width, $W_{ILS}$, of electrode 114. In the illustrative embodiment, both the interconnect line segments 116 and 118 have a width, $W_{ILS}$ that is the same, or substantially the same, as the width, $W_{SOT}$, of the electrode 114.

In some embodiments, at least a portion of the electrode 114 has a width, $W_{SOT}$, and at least one of the interconnect line segments 116, or 118 has a width, $W_{ILS}$ that is greater than $W_{SOT}$. In other embodiments, both of the interconnect line segments 116, 118 have a width, $W_{ILS}$ that is greater than $W_{SOT}$. In one such embodiment, each of the interconnect line segment 116 and 118 have a width, $W_{ILS}$.

The electrode 114 has a length, $L_{SOT}$ along a third direction (Z-axis) that is orthogonal to both the first and the second directions as shown in FIG. 1A. In an embodiment, the electrode 114 separates the pair of interconnect line segments 116 and 118 by a length, $L_{SOT}$ of the electrode 114. In some embodiments, the length, $L_{SOT}$ is at least equal to a length of the free magnet, $L_{MTJ}$. In an embodiment, when the MTJ has a substantially circular profile, the $L_{MTJ}$ is equal to a diameter of the circular profile. In some such embodiments, the diameter of the free magnet 108, and the interconnect line segments 116 and 118 are separated by a distance that is at least equal to a diameter of the free magnet 108.

In other embodiments, the electrode 114 separates the pair of interconnect line segments 116 and 118 by a distance that no more than 20% greater than a diameter of the free magnet 108. In one such embodiment, some of the joule heating in the electrode 114, described above, is lost to layers other than the free magnet 108 that are adjacent to the electrode 114.

The pair of interconnect lines segments 116 or 118 each have a length, $L_{ILS}$, that is determined by a minimum length needed to generate a spin diffusion current in the electrode 114. In an embodiment, such a minimum length is a spin correlation length, and depends on the choice of material of the electrode 114. For practical considerations, at least one of the pair of interconnect lines segments 116 or 118 has a length $L_{ILS}$, that is at least equal to or greater than the length, $L_{SOT}$. In other embodiments, at least one of the pair of interconnect lines segments 116 or 118 has a length $L_{ILS}$, that is at least equal to a diameter of the free magnet 108 (for an MTJ device 104 with a circular profile). In some embodiments, $L_{ILS}$, $L_{SOT}$ and $L_{MTJ}$ are substantially similar in magnitude. In the illustrative embodiment, $L_{ILS}$ is greater than $L_{MTJ}$. Depending on embodiments, $L_{SOT}$ is between 10 nm and 100 nm.

Depending on embodiments the electrode 114 may be above the free magnet 108 or below the free magnet 108. For instance, a lowermost surface of the electrode 114 and a lowermost surface of the of the interconnect line segments 116 and 118 are co-planar or substantially co-planar when the free magnet 108 is below the electrode 114, as illustrated in FIG. 1A.

The electrode 114 includes a metal with high degree of spin orbit coupling. A metal with a high degree of SOC has an ability to inject a large spin polarized current in to the free magnet 108. A large spin polarized current can exert a large amount of torque and influence the magnetization of the free magnet 108 to switch faster. In an embodiment, the electrode 114 includes a metal such as but not limited to tantalum, tungsten, platinum or gadolinium, β-Tantalum (β-Ta), Ta, β-Tungsten (β-W), W, Pt, Copper (Cu) doped with elements such as Iridium, Bismuth and any of the elements of 3d, 4d, 5d and 4f, 5f periodic groups in the Periodic Table which may exhibit high spin orbit coupling. Layers of 2D materials of $TiS_2$, $WS_2$, $MoS_2$, $TiSe_2$, $WSe_2$, $MoSe_2$, $B_2S_3$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe2$, $TiOBiS_2$, $CeOBiS_2$, $PrOBiS_2$, $NdOBiS_2$, $LaOBiS_2$, or $SrFBiS_2$. An electrode 114 including a beta phase tantalum or beta phase tungsten has a high spin hall efficiency. With a high spin hall efficiency, the electrode 114 can generate a large spin hall current for a given charge current that is passed through the electrode 114. In an embodiment, the electrode 114 has thickness of between 2 nm-20 nm.

While the interconnect line segments 116 and 118 described above include predominantly a spin orbit coupling material, other combinations may include a multilayer stack having a conductive material on the spin orbit coupling material. Such a multilayer stack may be advantageous for increasing heating efficiency and for practical reasons.

The conductive layer may include a material that is different from the SOC material. For instance, the conductive layer may have a lower electrical resistance than an electrical resistance of the SOC material. A lower electrical resistance through a cross section of the conductive layer compared to the SOC material may prevent ohmic heating loss in the interconnect line segments.

Figure 1B:
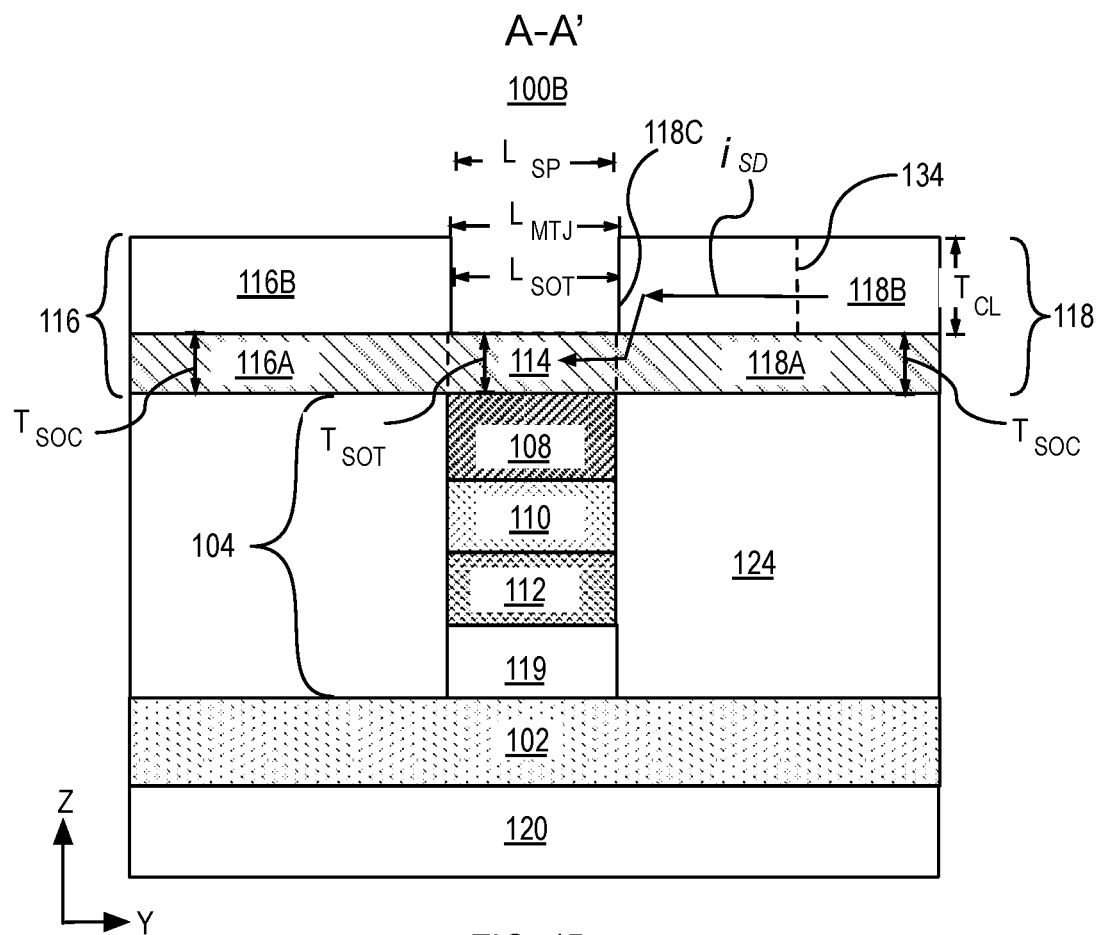
FIG. 1B illustrates a cross-sectional view through an axis of the spin orbit torque (SOT) memory device which includes an interconnect line segment having a multilayer stack, in accordance with embodiments of the present disclosure.

FIG. 1B illustrates a cross-sectional view of an SOT device 100B where each of the interconnect line segment 116 and 118 includes a multilayer stack, in accordance with an embodiment of the present disclosure. As illustrated, the interconnect line segment 116 includes a spin orbit coupling (SOC) layer 116A and a conductive layer 116B on the SOC layer 116A. As shown, interconnect line segment 118 also includes a SOC layer 118A and a conductive layer 118B on the SOC layer 118A. In an exemplary embodiment, SOC layers 116A and 118A include a same material and conductive layers 116B and 118B include a same material. In embodiments, the SOC layers 116A and 118A include a SOC material that is the same or substantially the same as the SOC material of the electrode 114. In exemplary embodiments, the SOC layers 116A and 118A include a SOC material that is different from the material of the conductive layers 116B and 118B. In some such exemplary embodiments, the conductive layers 116B and 118B have a lower electrical resistance than an electrical resistance of the SOC layers 116A and 118A. A low electrical resistance through a cross section 134 (dashed lines) of the conductive layer 118A, for example, may enable a substantial amount of electrical current, $i_{SD}$, to pass through the conductive layer 118B until it reaches sidewall 118. In an embodiment, the current, $i_{SD}$, upon reaching sidewall 118C diffuses into the SOC layer 118A and then flows into the electrode 114, as denoted by the arrow (associated with $i_{SD}$) in FIG. 1B.

In an embodiment, the conductive layers 116B and 118B may have a thickness that is greater than a thickness of the SOC layers 116A and 118A for practical considerations. In various applications, the conductive layers 116B and 118B may have a thickness ranging between 20 nm and 50 nm. In an embodiment, the conductive layers 116B and 118B include a material such as, but not limited to, Al, Mo, Ir, Co, alpha-phase W, Ag, Au or Cu (with a Ru liner).

Figure 1C:
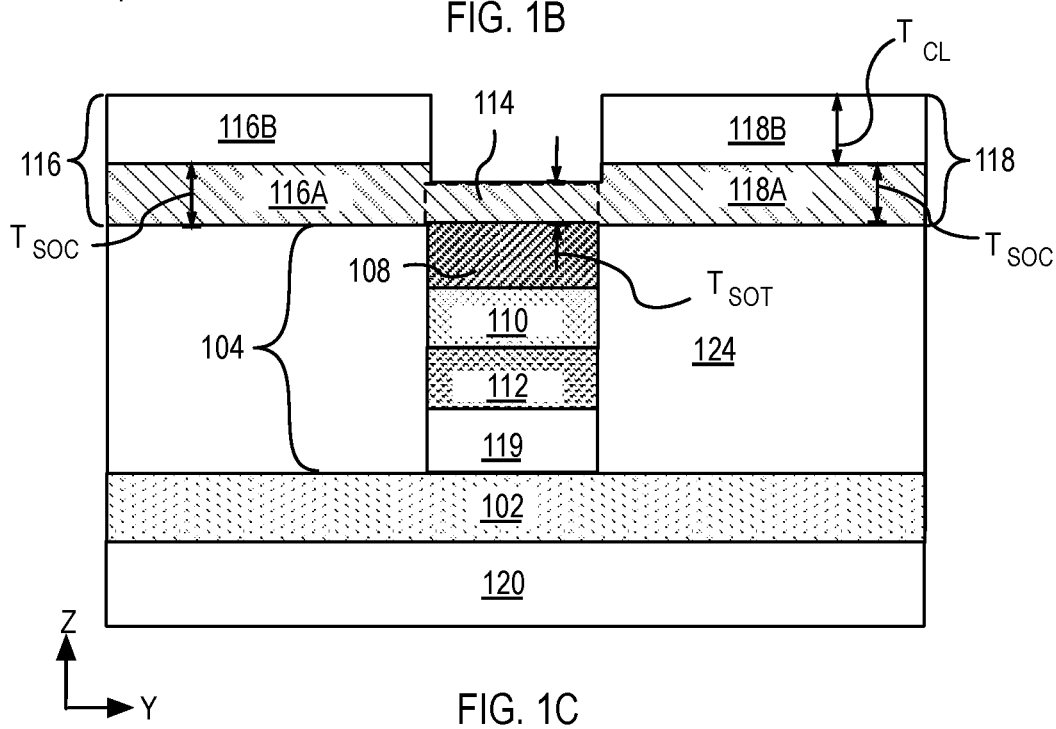
FIG. 1C illustrates a cross-sectional view through an axis of the spin orbit torque (SOT) memory device which includes an interconnect line segment having a multilayer stack, in accordance with embodiments of the present disclosure.

In an embodiment, SOC layers 116A and 118A each have a thickness, $T_{SOC}$ that is substantially the same as the thickness, $T_{SOT}$ of electrode 114, as shown. Thicknesses $T_{SOC}$ and $T_{SOC}$ may range between 1 nm and 10 nm. In other embodiments SOC layers 116A and 118A each have a thickness, $T_{SOC}$ that is greater than the thickness, $T_{SOT}$ of electrode 114, as shown in FIG. 1C. In some such embodiments, $T_{SOC}$ has is at least 1 nm thick. In an embodiment, a difference in a thickness of the SOC material in the electrode 114 compared to a thickness in the SOC layers 116A and 118A may arise during fabrication of the SOT device 100B.

Referring once again to FIG. 1B, in an embodiment, the MTJ device 104, has a length, $L_{MTJ}$, that is substantially equal to a spacing, $L_{SP}$, between the conductive layers 116B and 118B and equal to the length, $L_{SOT}$, of the electrode 114. Such an arrangement may advantageously provide joule heating to a substantial portion of an uppermost surface the free layer 108 and not increase joule heating in the SOC layers 116A and 118A.

Figure 1D:
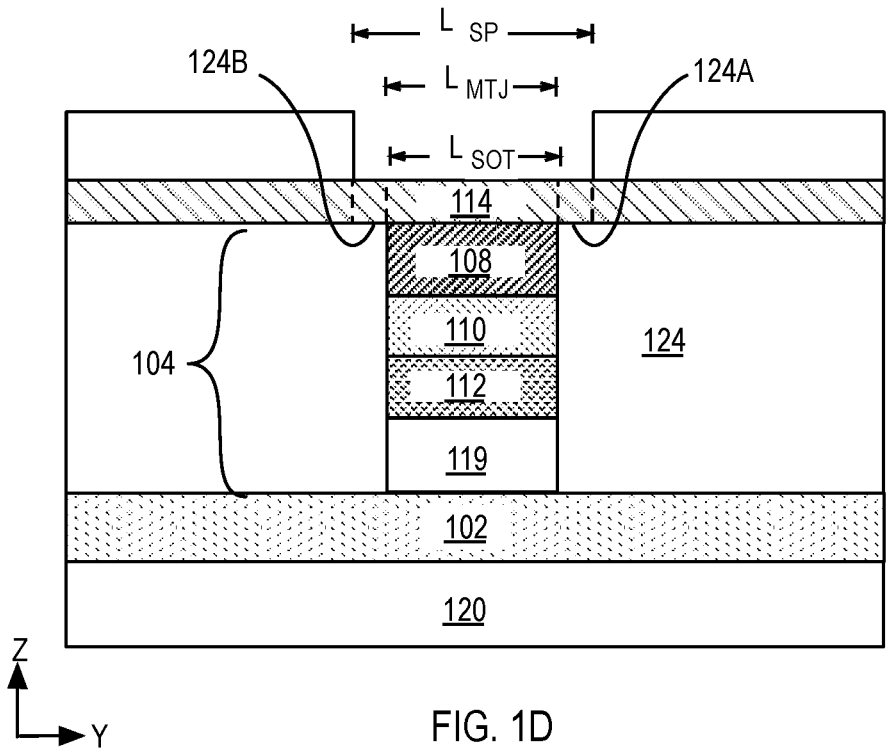
FIG. 1D illustrates a cross-sectional view through an axis of the spin orbit torque (SOT) memory device which includes an interconnect line segment having a multilayer stack, in accordance with embodiments of the present disclosure.

In other examples, such as is shown in FIG. 1D, the spacing, $L_{SP}$, between the conductive layers 116B and 118B may be greater than the length, $L_{SOT}$, of the electrode 114 for practical reasons. In one such embodiment, a portion of joule heating may be lost to portions 124A and 124B of an adjacent dielectric material 124.

Referring once again to FIGS. 1A-1D, in an embodiment, the free magnet 108 includes a magnetic material such as Co, Ni, Fe or alloys of these materials. In an embodiment, the free magnet 108 includes a magnetic material such as CoB, FeB, CoFe and CoFeB. In an embodiment, the free magnet 108 of the MTJ 104 includes alloys such as CoFe, CoFeB, FeB, doped with tungsten, tantalum, or molybdenum to promote high perpendicular anisotropy. In an embodiment, the free magnet 108 of the MTJ 104 includes alloys such as CoFe, CoFeB, FeB, having one or more layers of tungsten, tantalum, or molybdenum to promote high perpendicular anisotropy. In some embodiments, the free magnet 108 includes a $Co_{100-x-y}Fe_xB_y$, where X and Y each represent atomic percent, further where X is between 50-80 and Y is between 10 and 40, and further where the sum of X and Y is less than 100. In one specific embodiment, X is 60 and Y is 20. In an embodiment, the free magnet 108 is FeB, where the concentration of boron is between 10 and 40 atomic percent of the total composition of the FeB alloy. In an embodiment, the free magnet 108 has a thickness between 0.9 nm and 2.0 nm for perpendicular MTJ devices.

In an embodiment, tunnel barrier 110 includes a material suitable for allowing electron current having a majority spin to pass through tunnel barrier 110, while impeding, at least to some extent, electron current having a minority spin from passing through tunnel barrier 110. Thus, tunnel barrier 110 (or spin filter layer) may also be referred to as a tunneling layer for electron current of a particular spin orientation. In an embodiment, the tunnel barrier 110 includes a material such as, but not limited to, oxygen and at least one of magnesium (e.g., a magnesium oxide, or MgO), or aluminum (e.g., an aluminum oxide such as $Al_2O_3$). In the illustrative embodiment, the tunnel barrier 110 including MgO has a crystal orientation that is (001) and is lattice matched to fixed magnet 112 below the tunnel barrier 110 and free magnet 108 above tunnel barrier 110. In an embodiment, a free magnet 108 including a $Co_{100-x-y}Fe_xB_y$, is highly lattice matched to the tunnel barrier 110 including an MgO. Lattice matching a crystal structure of the free magnet 108 with the tunnel barrier 110 enables a higher tunneling magnetoresistance (TMR) ratio in the pMTJ device 104. In an embodiment, tunnel barrier 110 is MgO and has a thickness in the range between 1 nm to 2 nm.

In an embodiment, the fixed magnet 112 includes magnetic materials with sufficient perpendicular magnetization. In an embodiment, the fixed magnet 112 of the MTJ device 104 can include alloys such as CoFe, CoFeB, FeB. The alloys of CoFe, CoFeB, FeB may include doping with one or more of Ta, Hf, W, Mo, Ir, Ru, Si or C, to promote high perpendicular anisotropy. Alternatively, the alloys of CoFe, CoFeB, FeB may include thin layers of W, Ta or Molybdenum to promote high perpendicular anisotropy. In an embodiment, the fixed magnet 112 comprises a $Co_{100-x-y}Fe_xB_y$, where X and Y each represent atomic percent, further where X is between 50-80 and Y is between 10-40, and further where the sum of X and Y is less than 100. In one specific embodiment, X is 60 and Y is 20. In an embodiment, the fixed magnet 112 is FeB, where the concentration of boron is between 10-40 atomic percent of the total composition of the FeB alloy.

Figure 1E:
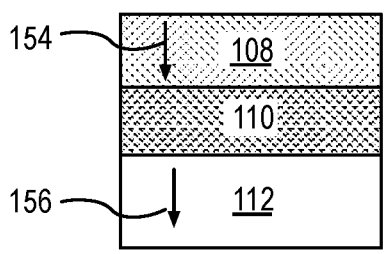
FIG. 1E illustrates a cross-sectional view depicting the direction of magnetization in a free magnet relative to the direction of magnetization in a fixed magnetic layer, in accordance with an embodiment of the present disclosure.

FIG. 1E illustrates a cross-sectional view depicting the free magnet 108 of the MTJ device 104 having a direction of magnetization (denoted by the direction of the arrow 154) that is anti-parallel to a direction of magnetization (denoted by the direction of the arrow 156) in the fixed magnet 112. When the direction of magnetization 154 in the free magnet 108 is opposite (anti-parallel) to the direction of magnetization 156 in the fixed magnet 112, the MTJ device 104 device is said to be in a high resistance state.

Figure 1F:
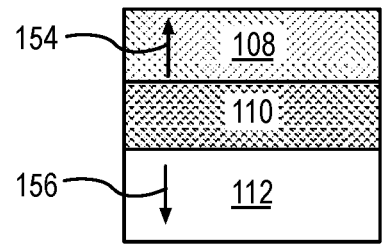
FIG. 1F illustrates a cross-sectional view depicting the direction of magnetization in a free magnet relative to the direction of magnetization in a fixed magnetic layer, in accordance with an embodiment of the present disclosure.

Conversely, FIG. 1F illustrates a cross-sectional view depicting the free magnet 108 of the MTJ device 104 having a direction of magnetization (denoted by the direction of the arrow 154) that is parallel to a direction of magnetization (denoted by the direction of the arrow 156) in the fixed magnet 112. When the direction of magnetization 154 in the free magnet 108 is parallel to the direction of magnetization 156 in the fixed magnet 112, the MTJ device 104 is said to be in a low resistance state.

In an embodiment, the free magnet 108 and the fixed magnet 112 can have approximately similar thicknesses and an injected spin polarized current which changes the direction of the magnetization 154 in the free magnet 108 can also affect the magnetization 156 of the fixed magnet 112. In an embodiment, to make the fixed magnet 112 more resistant to accidental flipping the fixed magnet 112 has a higher magnetic anisotropy than the free magnet structure 106. To reduce the stray field acting on the free magnet a synthetic antiferromagnetic (SAF) structure may be utilized. Referring once again to FIGS. 1A-1D, MTJ device 104 further includes a synthetic antiferromagnetic (SAF) structure 119 between the electrode 102 and the fixed magnet 112.

Figure 1G:
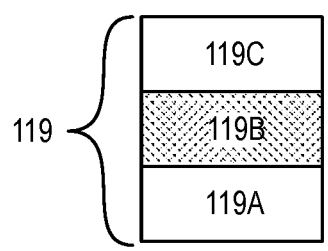
FIG. 1G illustrates a cross-sectional view of individual layers of a synthetic antiferromagnetic structure, in accordance with an embodiment of the present disclosure.

FIG. 1G illustrates a cross-sectional view of the SAF structure 119, in an accordance of an embodiment of the present disclosure. In an embodiment, the SAF structure 119 includes a non-magnetic layer 119B sandwiched between a first pinning ferromagnet 119A and a second pinning ferromagnet 119C as depicted in FIG. 1D. The first pinning ferromagnet 119A and the second pinning ferromagnet 119C are anti-ferromagnetically coupled to each other. The pinning ferromagnets 119A, 119C may be designed to have high coercive fields and a high degree of perpendicular magnetic anisotropy. In an embodiment, the first pinning ferromagnet 119A includes a layer of a magnetic metal such as Co, Ni, Fe, or alloys of magnetic metals such as Co, Ni, Fe, alloys such as Co—Pd, Cp-Pt, Co—W or Co—Mo. In other embodiments the first pinning ferromagnet 119A includes one or more bilayers having a layer of non-magnetic metal on a layer of magnetic metal such as, but not limited to, Co/Pd, Co/Pt, Co/Ni, Co/W or Co/Mo. In an embodiment, the second pinning ferromagnet 119C includes a layer of a magnetic metal such as Co, Ni, Fe, or alloys of magnetic metals such as Co, Ni, Fe, alloys such as Co—Pd, Cp-Pt, Co—W or Co—Mo. In other embodiments the second pinning ferromagnet 119C includes one or more bilayers having a layer of non-magnetic metal on a layer of magnetic metal such as, but not limited to, Co/Pd, Co/Pt, Co/Ni, Co/W or Co/Mo.

In an embodiment, the non-magnetic layer 119B includes a ruthenium or an iridium layer. In an embodiment, a ruthenium based non-magnetic layer 119B has a thickness between 0.3-1.0 nm to ensure that the coupling between the first pinning ferromagnet 119A and the second pinning ferromagnet 119C is anti-ferromagnetic (AF) in nature.

It is to be appreciated that an additional layer of non-magnetic spacer layer may exist between the fixed magnet 112 and the SAF structure 119 (not illustrated in FIG. 1A). A non-magnetic spacer layer enables coupling between the SAF structure 119 and the fixed magnet 112. In an embodiment, a non-magnetic spacer layer may include a metal such as Ta, Ru or Ir.

Referring again to FIG. 1A, in an embodiment, the electrode 102 includes a material such as Ta, TaN, or TiN. In an embodiment, the electrode 102 has a thickness between 5-70 nm. In an embodiment, the dielectric layer 120 includes an electrically insulating material such as, but not limited to, silicon dioxide, silicon nitride, silicon carbide, or carbon doped silicon oxide. In an embodiment, the substrate 122 includes a suitable semiconductor material such as but not limited to, single crystal silicon, polycrystalline silicon and silicon on insulator (SOI). In another embodiment, substrate 122 includes other semiconductor materials such as germanium, silicon germanium or a suitable group III-N or a group III-V compound. In the illustrative embodiment, the substrate 122 includes a layer of dielectric material such silicon oxide or silicon nitride above a semiconductor material such as but not limited to, single crystal silicon, polycrystalline silicon, silicon germanium or a suitable group III-N or a group III-V compound. Logic devices such as MOSFET transistors and access transistors and may be formed on the substrate 122. Logic devices such as access transistors may be integrated with memory devices such as SOT memory devices to form embedded memory. Embedded memory including SOT memory devices and logic MOSFET transistors can be combined to form functional integrated circuits such as a system on chip.

Figure 2A:
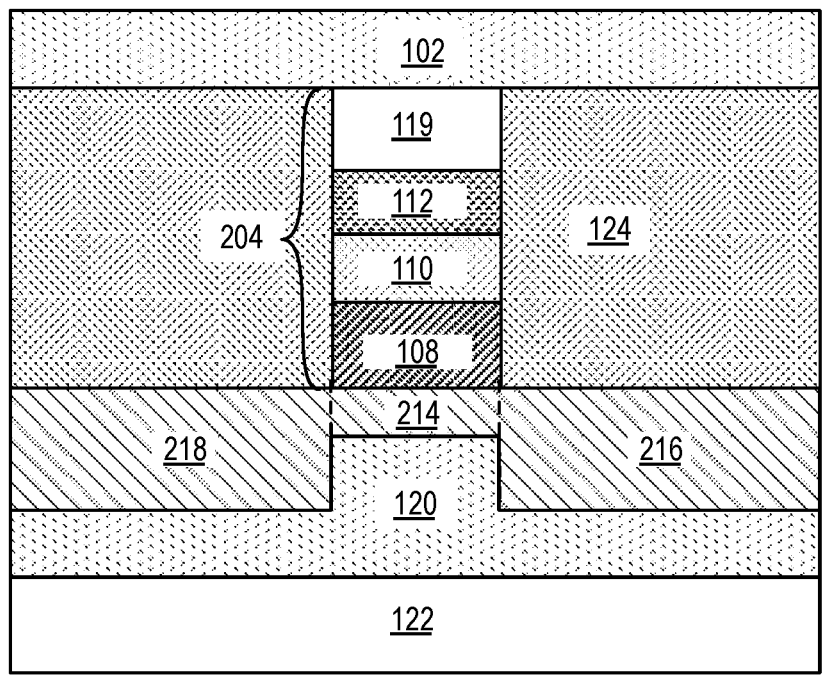
FIG. 2A illustrates a cross-sectional view of an SOT memory device, where an MTJ device is above an SOT electrode between a pair of interconnect line segments, in accordance with an embodiment of the present disclosure.

In the embodiments described in FIGS. 1A and 1B, the electrode 114 is above the MTJ device 104. In other embodiments, such as is shown in the cross-sectional illustration of FIG. 2A, the SOT device 200A includes an MTJ device 204 above an electrode 214. In the illustrative embodiment, MTJ device 204 includes a free magnet 108 that is on the electrode 214, a tunnel barrier 110 on the free magnet 108, a fixed magnet 112 on the tunnel barrier 110 and a SAF structure 119 on the fixed magnet 112. SOT device 200A further includes a pair of interconnect line segments 216 and 218 that have one or more features of the interconnect line segments 116 and 118, respectively. In the illustrative embodiment, a top of the electrode 214 and top of the interconnect line segments 218 and 216 are co-planar or substantially co-planar. In an embodiment, electrode 214 has one or more features of the electrode 114 described in FIG. 1A. In an embodiment, electrode 214 includes a material that is the same or substantially the same as the material of electrode 114.

Figure 2B:
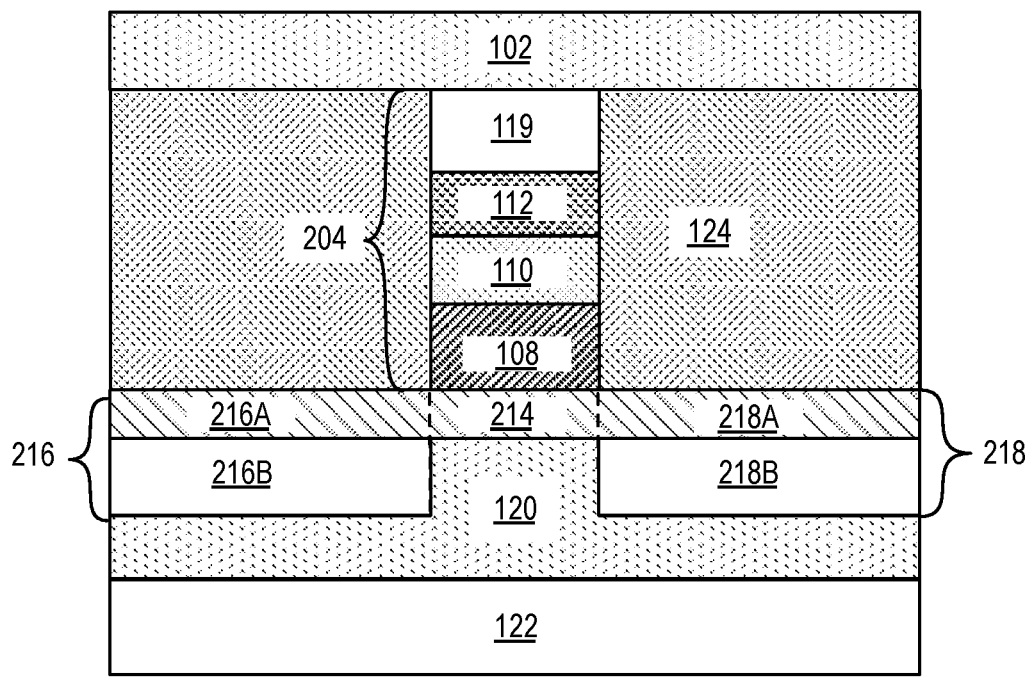
FIG. 2B illustrates a cross-sectional view of an SOT memory device, where an MTJ device is above an SOT electrode between a pair of interconnect line segments that includes a multilayer stack, in accordance with an embodiment of the present disclosure.

FIG. 2B illustrates a cross-sectional view of an SOT memory device 200B, where the MTJ device 104 is above an electrode 214, and where the interconnect line segments 216 and 218 include a multilayer stack, in accordance with an embodiment of the present disclosure. In the illustrative embodiment, the interconnect line segment 216 includes a SOC layer 216A on a conductive layer 216B and the interconnect line segment 218 includes a SOC layer 218A on a conductive layer 218B. In an embodiment, the SOC layers 216A and 218A has a thickness that is at least as thick as a thickness $T_{SOT}$ of the electrode 214. In the illustrative embodiment, a top of the electrode 214 and top of the SOC layers 216A and 218A are co-planar or substantially co-planar with an uppermost surface of the electrode 214. In some embodiments, SOC layers 216A and 218A have one or more features of the SOC layers 116A and 118A, respectively. In an embodiment, electrode 214 has one or more features of the electrode 114 described in FIG. 1B. In an embodiment, electrode 214 includes a material that is the same or substantially the same as the material of electrode 114.

Figure 3A:
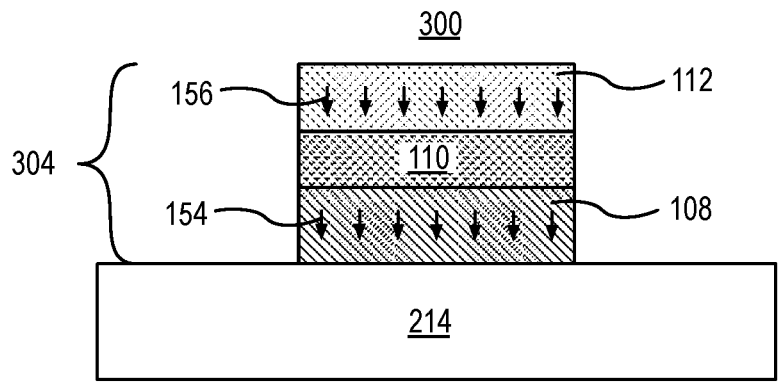
FIG. 3A illustrates an SOT memory device in a low resistance state.
Figure 3B:
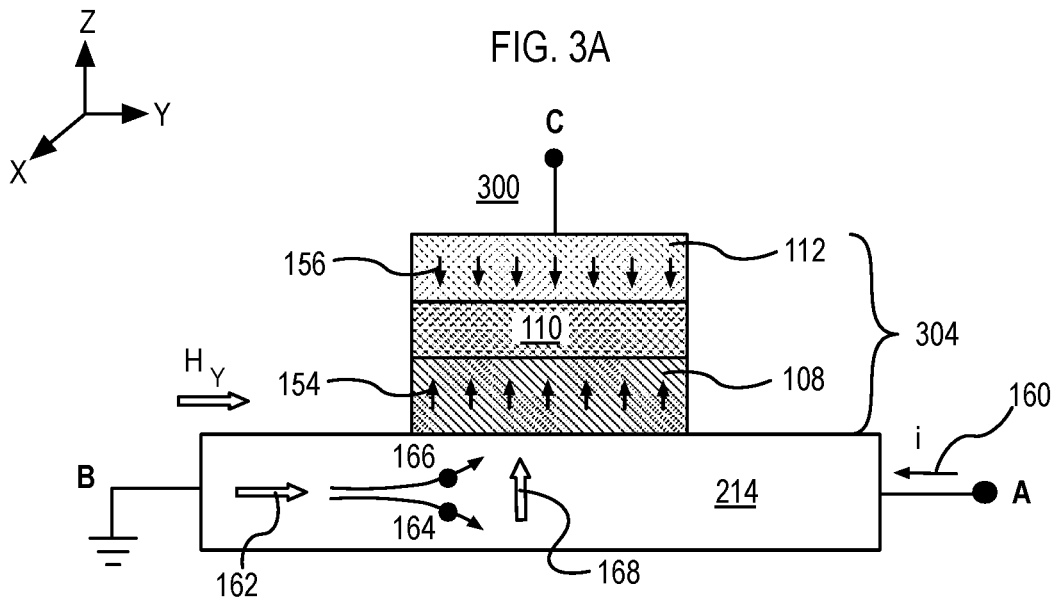
FIG. 3B illustrates an SOT memory device switched to a high resistance state after the application of a spin hall current, a spin torque transfer current and/or an external magnetic field.
Figure 3C:
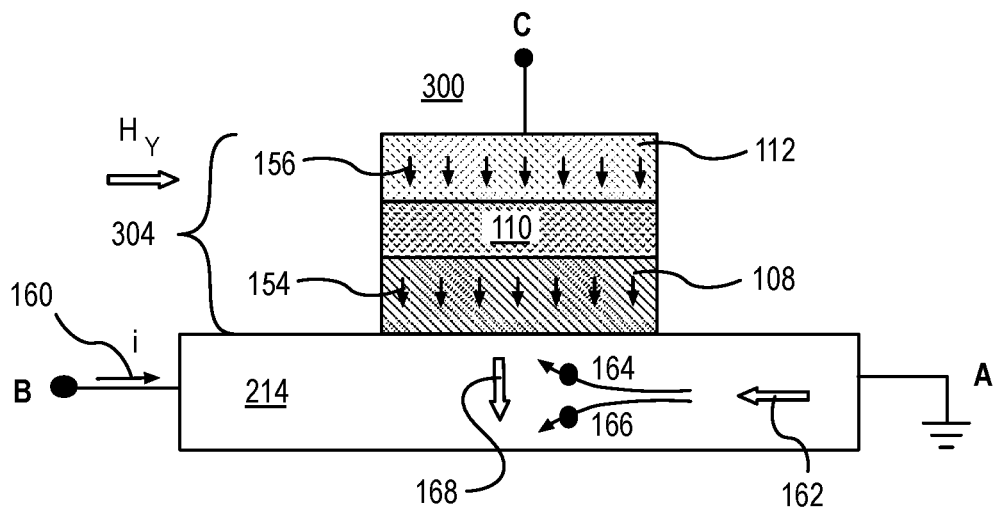
FIG. 3C illustrates an SOT memory device switched to a low resistance state after the application of a spin hall current, a spin torque transfer current and/or an external magnetic field.

FIGS. 3A-3C illustrate a mechanism for switching a spin orbit torque (SOT) memory device such as a spin orbit torque (SOT) memory device 300 including an MTJ device 104 on an spin orbit torque electrode such as electrode 114. Interconnect line segments such as interconnect line segment 116 and 118 are not illustrated in FIG. 3A-3C. In the illustrative embodiment, the MTJ device 104 includes one or more features of the MTJ device 104, such as the free magnet 108, the fixed magnet 112 and the tunnel barrier 110 between the free magnet 108, the fixed magnet 112.

FIGS. 3A-3C illustrate a mechanism for switching a spin orbit torque (SOT) memory device such as a spin orbit torque (SOT) memory device 300 including an MTJ device 304 on an spin orbit torque electrode such as electrode 214. Interconnect line segments such as interconnect line segment 116 and 118 are not illustrated in FIG. 3A-3C. In the illustrative embodiment, the MTJ device 304 includes one or more features of the MTJ device 304, such as the free magnet 108, the fixed magnet 112 and the tunnel barrier 110 between the free magnet 108, the fixed magnet 112.

FIG. 3A illustrates an SOT memory device 300 including the MTJ device 304 on the electrode 214, where a magnetization 154 of the free magnet 108 is aligned in a direction parallel to the magnetization 156 of the fixed magnet 112. In an embodiment, the direction of magnetization 154 of the free magnet 108 and the direction of magnetization 156 of the fixed magnet 112 are both in the negative Z-direction as illustrated in FIG. 3A. As discussed above, when the magnetization 154 of the free magnet 108 is in the same direction as a magnetization 156 of the fixed magnet 112, MTJ device 104 is in a low resistance state.

FIG. 3B illustrates the MTJ device 104 of the spin orbit torque (SOT) memory device 300 switched to a high resistance state. In an embodiment, a reversal in the direction of magnetization 154 of the free magnet 108 in FIG. 3B relative to the direction of magnetization 154 of the free magnet 108 in FIG. 3A is brought about by (a) inducing a spin diffusion current 168 in the electrode 214 in the Y-direction, (by applying a positive voltage bias on terminal A with respect to a grounded terminal B), and/or (c) by applying an external magnetic field, $H_Y$, 170 in the Y-direction.

In an embodiment, a charge current 160 is passed through the electrode 214 in the negative y-direction. In response to the charge current 160, an electron current 162 flows in the positive y-direction. The electron current 162 includes electrons with two opposing spin orientations, a type I electron 166, having a spin oriented in the negative x-direction and a type II electron 164 having a spin oriented in the positive X-direction. In an embodiment, electrons in the electron current 162 experience a spin dependent scattering phenomenon in the electrode 214. The spin dependent scattering phenomenon is brought about by a spin-orbit interaction between the nucleus of the atoms in the electrode 214 and the electrons in the electron current 162. The spin dependent scattering phenomenon causes type I electrons 166, whose spins are oriented in the negative x-direction (into the page of FIG. 3B), to be deflected upwards towards an uppermost portion of the electrode 214 and type II electrons 164 whose spins are oriented in the positive X-direction to be deflected downwards towards a lowermost portion of the electrode 214. The separation between the type I electrons 166 and the type II electrons 164 induces a polarized spin diffusion current 168 in the electrode 214. In an embodiment, the polarized spin diffusion current 168 is directed upwards toward the free magnet 108 of the MTJ device 104, as is depicted in FIG. 3B. The polarized spin diffusion current 168 induces a Spin Hall torque on the magnetization 154 of the free magnet 108. In an embodiment, a torque can also be exerted on the magnetization 154 of the free magnet 108 by applying an external magnetic field, $H_Y$, in the Y-direction, as illustrated in FIG. 3B. In the illustrative embodiment, the external magnetic field, $H_Y$, provides a torque component (in the positive Z direction) to switch the magnetization 154 of the free magnet 108.

FIG. 3C illustrates the MTJ device 104 of the spin orbit torque (SOT) memory device 300 switched to a low resistance state. In an embodiment, a reversal in the direction of magnetization 154 of the free magnet 108 in FIG. 3C compared to the direction of magnetization 154 of the free magnet 108 in FIG. 3B is brought about by (a) reversal in the direction of the spin diffusion current 168 in the electrode 214 (by applying a positive voltage bias on terminal B with respect to a grounded terminal A), and/or (b) by applying an external magnetic field, $H_Y$, 170 in the negative Y-direction. In some embodiments, the direction of the external magnetic field, $H_Y$ is not reversed (not shown.)

A read operation to determine a state of the MTJ device 204 may be performed by voltage biasing a third terminal C, connected to the fixed magnet 112 with respect to the either terminal and A and B, where the terminals A or B are grounded (not illustrated).

Figure 4:
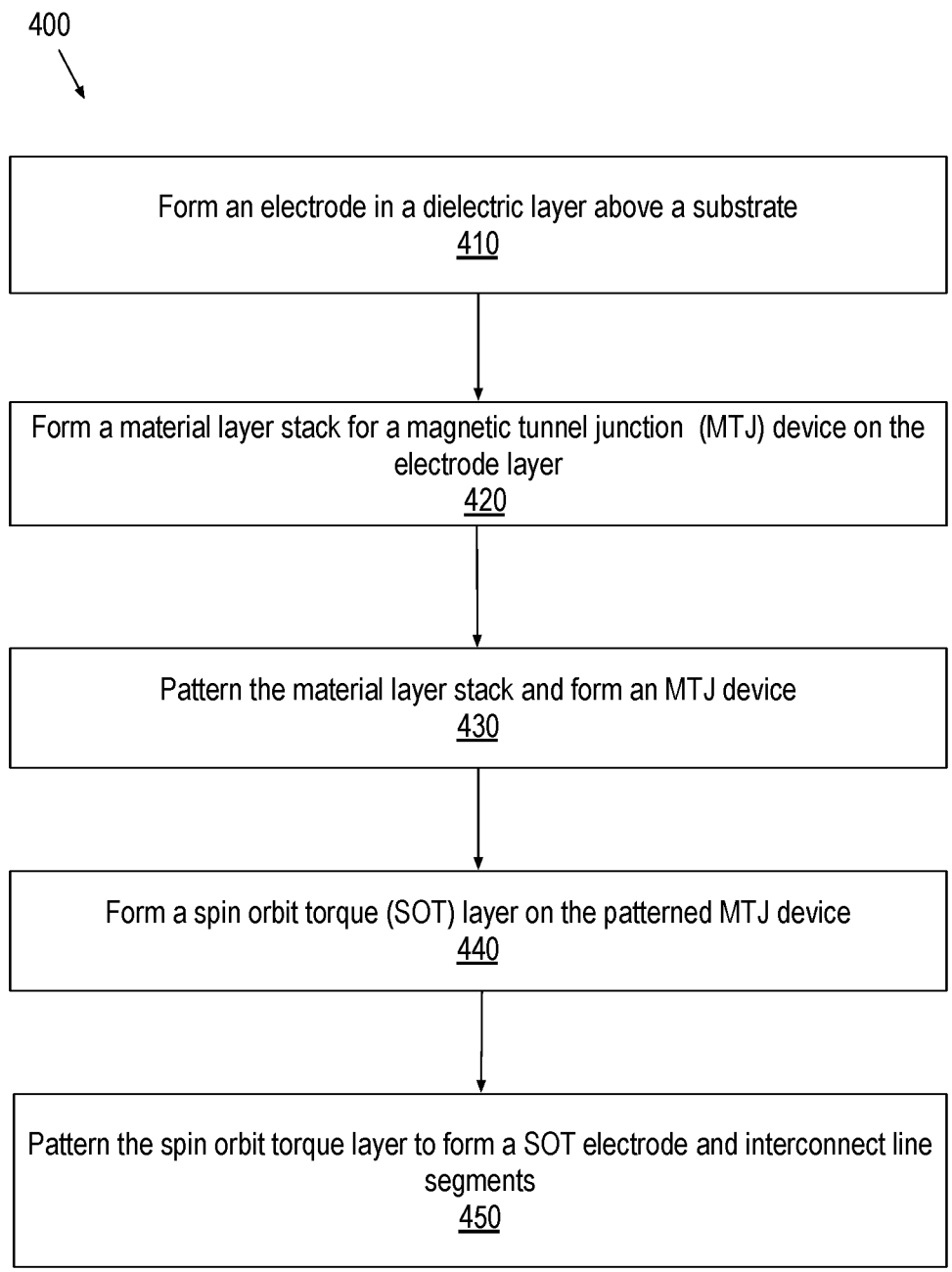
FIG. 4 illustrates a flow chart depicting a method of fabricating an SOT memory device in accordance with embodiments of the present invention.

FIG. 4 illustrates a flow diagram of a method to fabricate an SOT memory device. The method 400 begins at operation 410 by forming a first electrode in a dielectric layer above a substrate. The method 400 continues at operation 420 with the formation of a second SOT electrode material on the first SOT electrode material.

The method 400 continues at operation 420 with the formation of a material layer stack for the formation of an MTJ device on the first electrode. In exemplary embodiments, all layers in the material layer stack and the second SOT material are blanket deposited in-situ without breaking vacuum. In a simplest embodiment, forming the material layer stack includes a deposition of a free magnetic layer on the second SOT material, deposition of a tunnel barrier layer over the free magnetic layer, deposition of a fixed magnetic layer over the tunnel barrier layer, deposition of a synthetic antiferromagnetic (SAF) layer over the fixed magnetic layer, and deposition of a conductive material on the SAF layer.

The method 400 is continued at operation 430 with patterning of the material layer stack to form an MTJ device. The method 400 is then resumed at operation 440 with the deposition of spin orbit coupling material. The method 400 is then resumed at operation 450 with the patterning of the spin orbit coupling material to form a second electrode and further patterning of the second electrode to form a first interconnect line segment and a second interconnect line segment opposite to the first interconnect line segment.

Figure 5A:
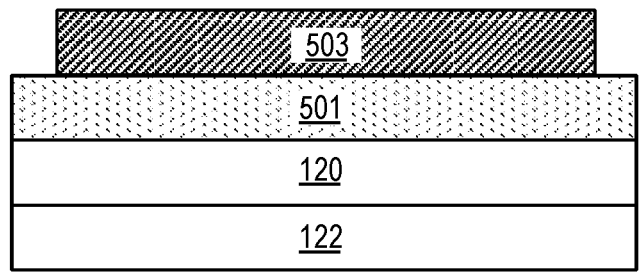
FIG. 5A illustrates a cross-sectional view of the formation of a conductive layer on a dielectric layer formed above a substrate, in an accordance with embodiments of the present disclosure.

FIG. 5A illustrates a cross-sectional view of the formation of a layer of conductive material 501 on a dielectric layer 120 formed above a substrate 122, in an accordance with embodiments of the present disclosure. In an embodiment, the layer of conductive material 501 includes a material that is the same or substantially the same as the material of electrode 102. In some embodiments, the layer of conductive material 501 has a thickness that is between 20 nm-50 nm, as deposited. FIG. 5A further illustrates a mask 503 formed above the conductive material 501.

In some embodiments, the mask 503 is formed by a lithographic process. In other embodiments, the mask 503 includes a dielectric material that has been patterned. The mask 503 defines a size of an electrode that will subsequently be formed. In some embodiments, the mask 503 has a rectangular shape, to form an electrode such as electrode 102 depicted in the isometric illustration of FIG. 1A.

Figure 5B:
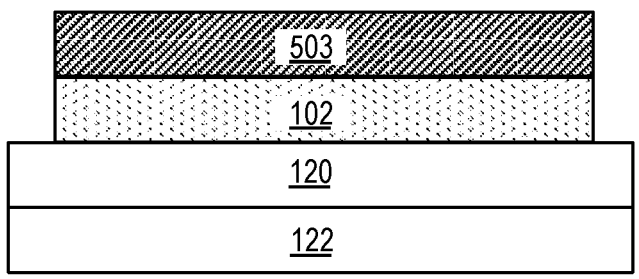
FIG. 5B illustrates a cross-sectional view of the structure in FIG. 5A following patterning of the electrode layer to form a first electrode.

FIG. 5B illustrates a cross-sectional view of the structure in FIG. 5A following the patterning of the electrode layer to form an electrode 102. In an embodiment, the layer of conductive material 501 is patterned by a plasma etch process selectively to the mask 503, to form an electrode 102. In some embodiments, upon completion of the etch process, any portion of mask 503 remaining after the etch process is removed.

Figure 5C:
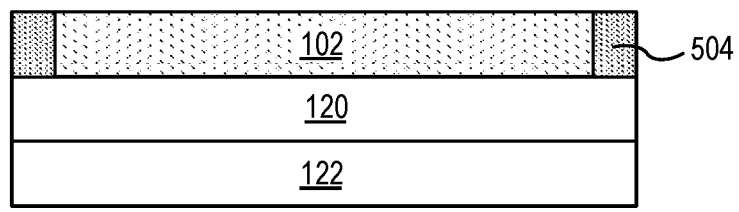
FIG. 5C illustrates a cross-sectional view of the structure in FIG. 5B following the deposition of a dielectric layer on the mask and on sidewalls of the first electrode, and following planarization of the dielectric layer, the mask and portions of the first electrode.

FIG. 5C illustrates a cross-sectional view of the structure in FIG. 5B following the deposition of a dielectric layer 504 on the mask 503 and on sidewalls of the electrode 102, and following planarization of the dielectric layer 504, the mask 503 and upper portions of the electrode 102. In another embodiment, the dielectric layer 504 is blanket deposited on the electrode 114 and on the dielectric layer 120 (after the mask 503 has been removed). In some examples, the dielectric layer 504 may include a material that is substantially the same as the material of the dielectric layer 120. A planarization process is carried out to remove the dielectric layer 504 above the electrode 102. In an embodiment, the planarization process further removes an upper portion of the electrode 114. In an embodiment, the electrode 102 and the dielectric layer 504 surrounding the electrode 102 have uppermost surfaces that are substantially co-planar following the planarization process. In an embodiment, the planarization process is a chemical mechanical polish process. In an example, the planarization process forms an electrode 102 having a topographically smooth uppermost surface with a surface roughness that is less than 1 nm. In an embodiment, the electrode 102 has a resultant thickness between 10 m-30 nm after the planarization process.

Figure 5D:
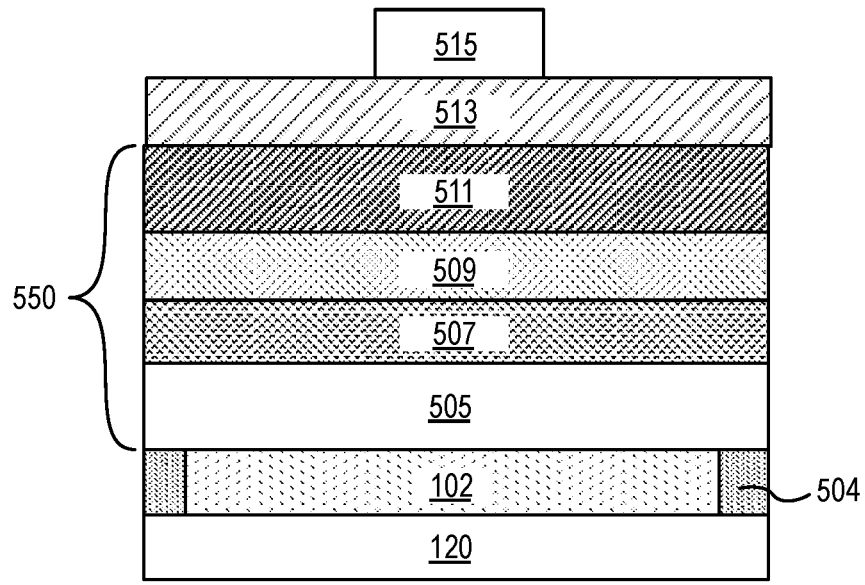
FIG. 5D illustrates a cross-sectional view of the structure in FIG. 5C following the formation of a material layer stack for a magnetic tunnel junction (MTJ) device on the electrode, following the formation of a hardmask layer on the material layer stack, and following the formation of a mask on a portion of the hardmask layer.

FIG. 5D illustrates a cross-sectional view of the structure in FIG. 5C following the formation of a material layer stack 550 for a magnetic tunnel junction (MTJ) device on the electrode 102, following the formation of a hardmask layer 513 on material layer stack 550, and following the formation of a mask 515 on the hardmask layer 513. The mask 515 defines a shape and size of an MTJ device and a location where the MTJ device is to be subsequently formed with respect the electrode 102.

In an embodiment, layers for a SAF structure 505 is formed on the electrode 102. In some embodiments, the layers utilized to form SAF structure 119 are blanket deposited on the electrode 102 using a PVD process. The layers utilized to form SAF structure 119 are the same or substantially the same as the layers in the SAF structure 119 described above.

In an embodiment, a fixed magnetic layer 507 is deposited on the layers for a SAF structure 505. The fixed magnetic layer 507 may be deposited using a PVD process or a plasma enhanced chemical vapor deposition process. In an embodiment, the fixed magnetic layer 507 includes a material that is the same or substantially the same as the material of the fixed magnet 112. In an embodiment, the deposition process forms a fixed magnetic layer 507 including CoFeB that is amorphous. In one example, fixed magnetic layer 507 is deposited to a thickness between 0.9 nm and 2.0 nm to fabricate a perpendicular MTJ. During an in-situ deposition process, a tunnel barrier layer 509 is then formed on the fixed magnetic layer 507, a free magnetic layer 511 is formed on the tunnel barrier layer 509 to complete formation of a material layer stack 550 for an MTJ.

In some embodiments, a tunnel barrier layer 509 is blanket deposited on the fixed magnetic layer 507. In an embodiment, the tunnel barrier layer 509 is a material including magnesium and oxygen or a material including aluminum and oxygen. In an exemplary embodiment, the tunnel barrier layer 509 is a layer of MgO and is deposited using a reactive sputter process. In an embodiment, the reactive sputter process is carried out at room temperature. In an embodiment, the tunnel barrier layer 509 is deposited to a thickness between 0.8 nm to 1 nm. In some examples, the deposition process is carried out in a manner that yields a tunnel barrier layer 509 having an amorphous structure. In some such examples, the amorphous tunnel barrier layer 509 becomes crystalline after performing a high temperature anneal process. In other embodiments, the tunnel barrier layer 509 is crystalline as deposited.

In an embodiment, the free magnetic layer 511 is blanket deposited on an uppermost surface of the tunnel barrier layer 509. In an embodiment, the deposition process includes a physical vapor deposition (PVD) or a plasma enhanced chemical vapor deposition process. In an embodiment, the PVD deposition process includes an RF or a DC sputtering process. In an exemplary embodiment, the free magnetic layer 511 is $Co_{100-x-y}Fe_xB_y$, where X and Y each represent atomic percent, further where X is between 50-80 and Y is between 10-40, and further where the sum of X and Y is less than 100. In some embodiments, the free magnetic layer 511 includes a material that is the same or substantially the same as the material of the free magnet 108 described above. In some examples, the free magnetic layer 511 may be deposited to a thickness between 2.0 nm and 3.0 nm. A thickness range between 2.0 nm and 3.0 nm may be sufficiently thin to provide perpendicular magnetic anisotropy required to fabricate a perpendicular MTJ.

The deposition process further includes forming a hardmask layer 513 on the MTJ material layer stack 550. The hardmask layer 513 may include a conductive material or a dielectric material.

In some embodiments, the deposition process is carried without an air break and the individual layers are blanket deposited using a variety of deposition processes in a cluster tool. Some layers may be deposited using a physical vapor deposition (PVD) process, for example. Other examples of deposition processes may include a co-sputter or a reactive sputtering process.

Figure 5E:
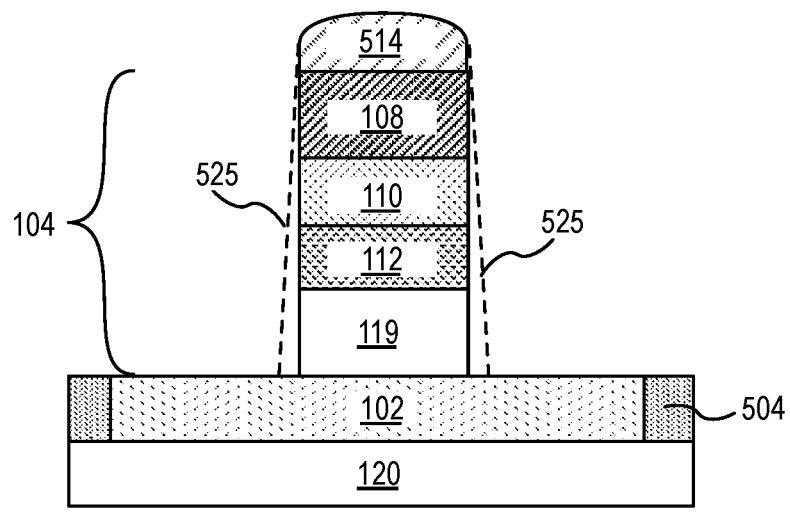
FIG. 5E illustrates a cross-sectional view of the structure in FIG. 5D following the process of etching the hardmask layer and the material layer stack to form a hardmask and a magnetic tunnel junction device, respectively, on the first electrode.

FIG. 5E illustrates a cross-sectional view of the structure in FIG. 5D following the process of etching the hardmask layer 513 and the material layer stack to form a magnetic tunnel junction device on the electrode 102. In an embodiment, the patterning process includes etching the hardmask layer 513 by a plasma etch process to form a hardmask 514. In an embodiment, the plasma etch process is then continued to pattern the remaining layers of the MTJ material layer stack 550 to form an MTJ device 104. The plasma etch process etches the various layers in the MTJ material layer stack 550 to form a free magnet 108, a tunnel barrier 110, a fixed magnet 112 and a SAF structure 119. The plasma etch process also exposes the electrode 102 and portions of the underlying dielectric layer 504. In some embodiments, depending on the etch parameters, the MTJ device 104 may have sidewalls that are tapered as indicated by the dashed lines 525.

Figure 5F:
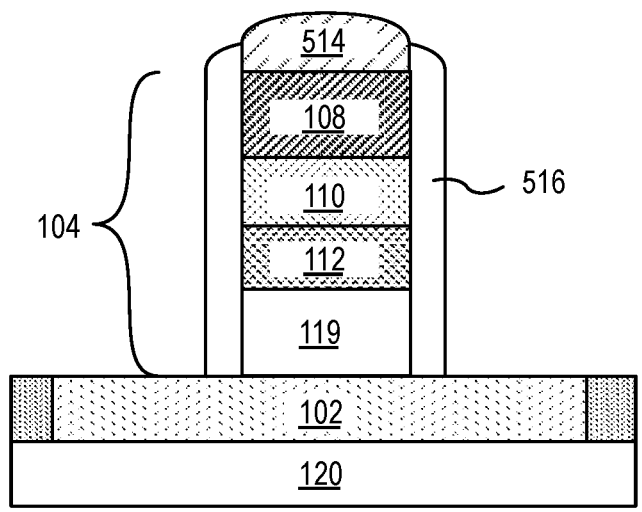
FIG. 5F illustrates a cross-sectional view of the structure in FIG. 5E following the formation of a dielectric spacer adjacent to the magnetic tunnel junction device, adjacent to the hardmask, and on portions of the first electrode.

FIG. 5F illustrates a cross-sectional view of the structure in FIG. 5E following the formation of a dielectric spacer 516 adjacent to the magnetic tunnel junction device 104 and on portions of the hardmask 514. In an embodiment, a dielectric spacer layer is also deposited on the uppermost surface of the electrode 102 and on the dielectric layer 504. In an embodiment, the dielectric spacer layer is deposited without a vacuum break following the plasma etch process. In an embodiment, the dielectric spacer layer includes a material such as, but not limited to, silicon nitride, carbon doped silicon nitride or silicon carbide. In an embodiment, the dielectric spacer layer includes an insulator layer that does not have an oxygen content. A material lacking in oxygen may minimize potential oxidation of magnetic layers in the MTJ device 104. In an embodiment, the dielectric spacer layer is etched by a plasma etch process forming dielectric spacer 516 on sidewalls of the pMTJ device 104. In some examples, the etch process may cause an uppermost portion of the dielectric layer 504 to become partially recessed leading to partial exposure of sidewalls of the electrode 102.

Figure 5G:
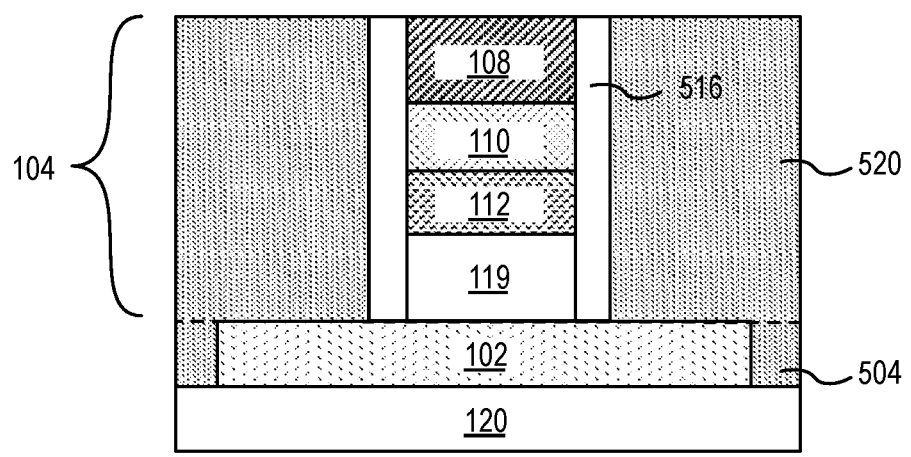
FIG. 5G illustrates a cross-sectional view of the structure in FIG. 5F following the formation of a dielectric layer on the hardmask and following a planarization of the dielectric layer and removal of the hardmask.

FIG. 5G illustrates a cross-sectional view of the structure in FIG. 5F following the formation of a dielectric layer on the hardmask 514 and following a planarization of the dielectric layer 520 and removal of the hardmask 514. In an embodiment, a planarization process similar to a CMP process described above is utilized to form co-planar or substantially coplanar uppermost surfaces of the dielectric layer 520 and the free layer 108 as illustrated. In some embodiments, mask 514 may be removed by a wet chemical process to prevent damage to the free magnet 108.

Figure 6A:
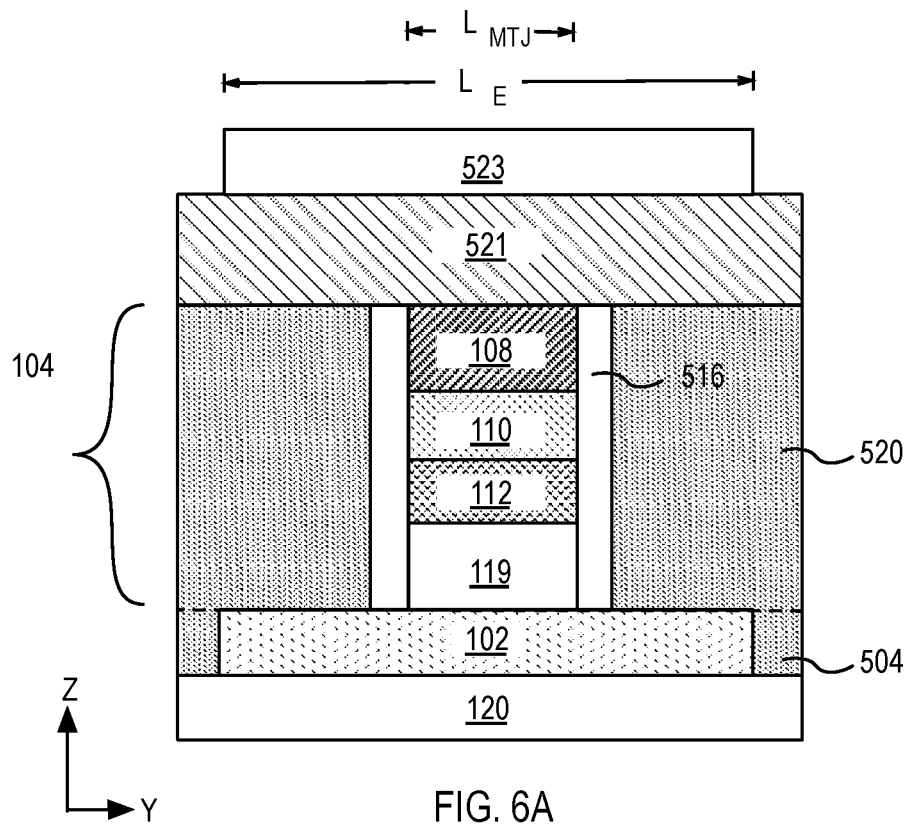
FIG. 6A illustrates a cross-sectional view structure of FIG. 5G following the formation of a layer of spin orbit coupling material on the MTJ and following the formation of a mask on the layer of spin orbit coupling material.

FIG. 6A illustrates a cross-sectional view of the structure in FIG. 5G following the formation of an layer of SOC material 521 on the free magnet 108, on the spacer 516 and on the dielectric layer 520 and following the formation of a mask 523 on the layer of SOC material 521. In an embodiment, the layer of SOC material 521 is the same or substantially the same as the material of electrode 114. In an embodiment, layer of SOC material 521 is blanket deposited to a thickness between 5 nm and 50 nm. A thickness between 5 nm and 50 nm is sufficiently thick to be planarized in a downstream operation.

Figure 6B:
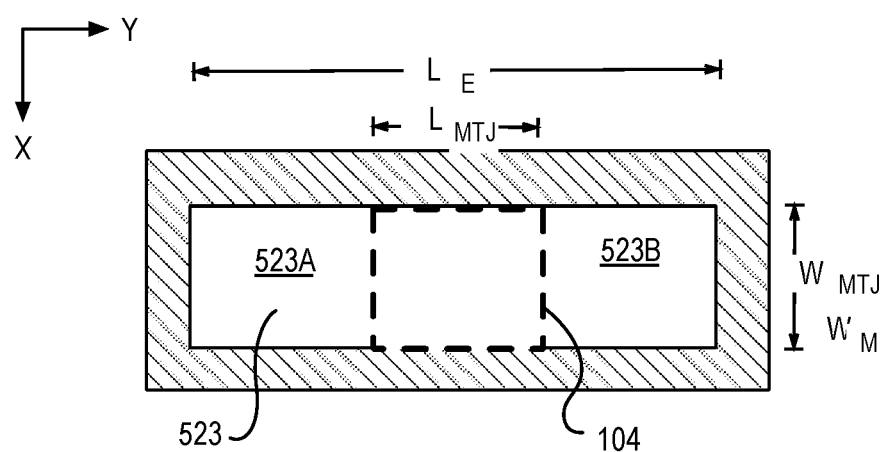
FIG. 6B illustrates a cross-sectional view of the structure in FIG. 6A.

FIG. 6B illustrates a plan view of the structure in FIG. 6A. In an embodiment, the mask 523 is designed to have a length, $L_E$, in a first direction, that extends beyond a length of the MTJ device 104, LAM has shown. In an embodiment, the mask 523 is designed to have a width, $W_M$ (in a second direction, orthogonal to the first direction) that is the same or substantially the same as a width of the MTJ device 104, $W_{MTJ}$, also as shown. The MTJ 104 is indicated by a dashed box in the illustration. The portions 523A and 523B of the mask 523, that are outside of the periphery of MTJ device 104, define regions where interconnect line segments to be subsequently formed in the layer of SOC material 521.

Figure 7A:
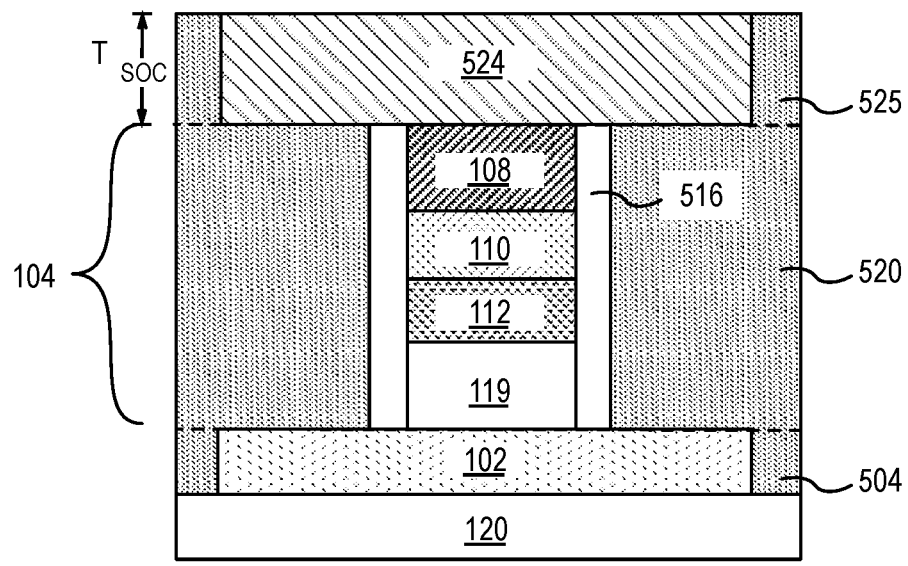
FIG. 7A illustrates a cross-sectional view of the structure in FIG. 6A following the formation of a spin orbit coupling structure on the MTJ device.

FIG. 7A illustrates a cross-sectional view of the structure in FIG. 6A following the patterning of the layer of SOC material 521 on the MTJ device to form a SOC structure 524. In an embodiment, a plasma etch is utilized to pattern the layer of SOC material 521. FIG. 7A further illustrates the formation of a dielectric layer 525 adjacent to the patterned SOC structure 524. In an embodiment, the dielectric layer 525 is first deposited on the patterned SOC structure 524 and then planarized to form the SOC structure 524 shown in FIG. 7A. In an embodiment, the SOC structure 524 has a thickness between 4 nm and 20 nm.

Figure 7B:
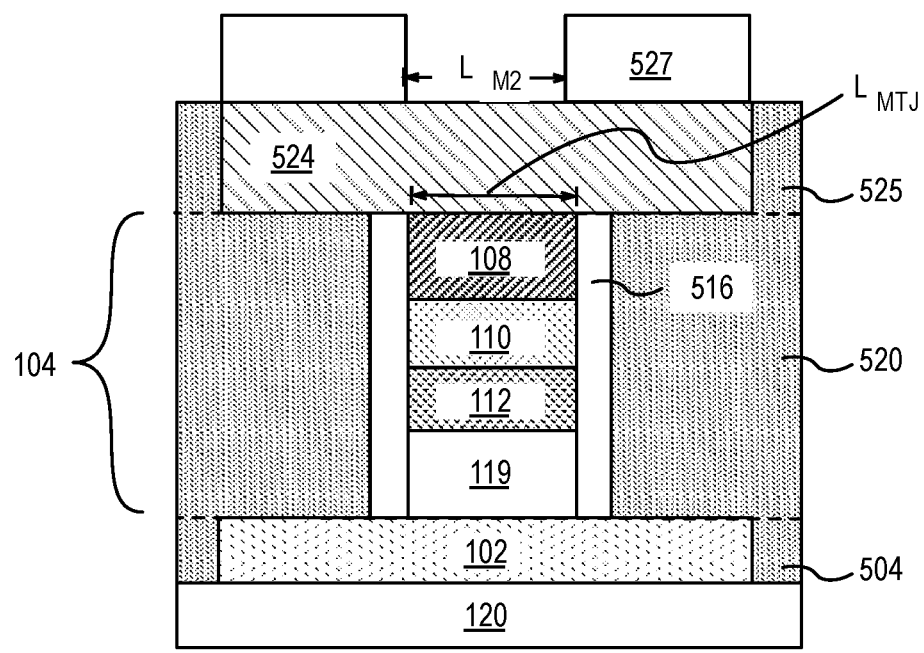
FIG. 7B illustrates a cross-sectional view of the structure in FIG. 7A following the formation of a mask on the spin orbit coupling structure.

FIG. 7B illustrates the structure of FIG. 7A following the formation of a mask 527 to recess a portion of the SOC structure directly above the MTJ device 104 to form interconnect line segments. The mask 527 has an opening 528 having a length, $L_{M2}$, that is the same or substantially the same as the length of the MTJ device 104, $L_{MTJ}$.

Figure 7C:
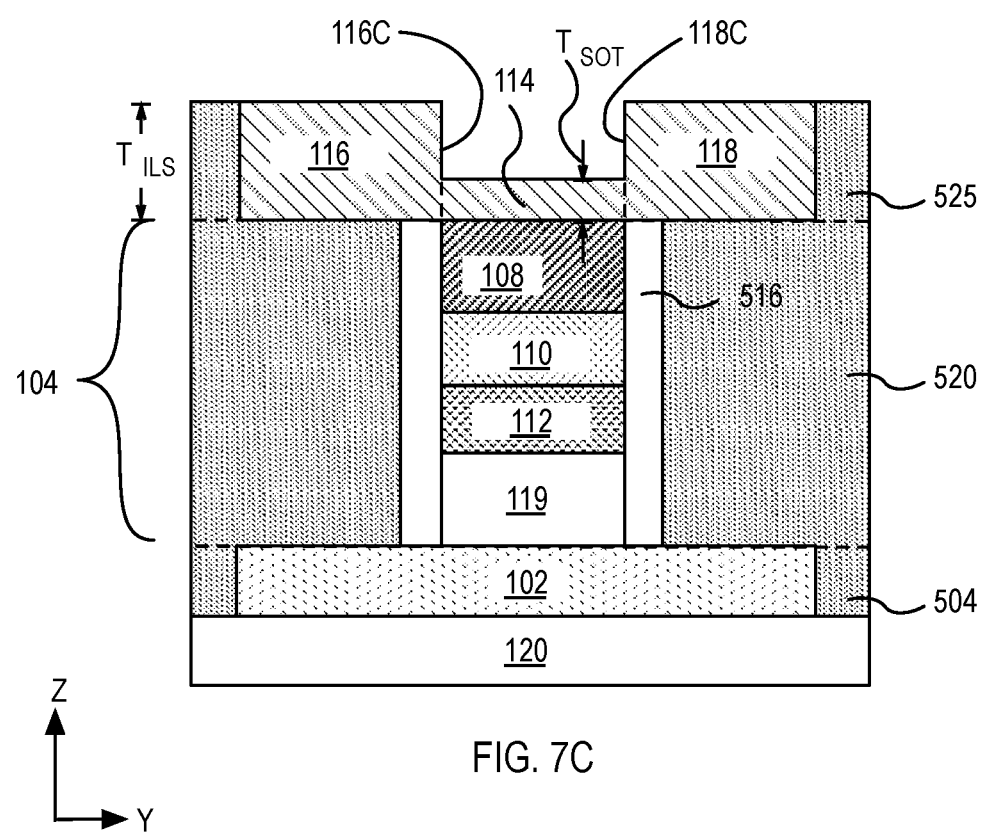
FIG. 7C illustrates a cross-sectional view of the structure in FIG. 7B following the process of etching a portion of the spin orbit coupling structure to form an SOT electrode between a pair of interconnect line segments.

FIG. 7C illustrates the structure of FIG. 7B following a process to recess a portion of the SOC structure 524 followed by removal of the mask 527. In an embodiment, a plasma etch process is utilized to recess a portion of the SOC structure 524 to form an electrode 114 above the MTJ device 104. The electrode 114 has a resultant thickness, $T_{SOT}$, that is sufficient to act as a spin orbit torque electrode. In embodiments, $T_{SOT}$, thickness is between 2 nm and 10 nm.

The process of recessing a portion of the SOC structure 524 also forms interconnect line segments 116 and 118 as shown. The thickness of the interconnect line segments 116 and 118, $T_{SOT}$, is between 20 nm-50 nm. In the illustrative embodiment, sidewalls 116C and 118C of the interconnect line segments 116 and 118, respectively are substantially vertical. In other embodiments, sidewalls 116C and 118C may be tapered.

Figure 8A:
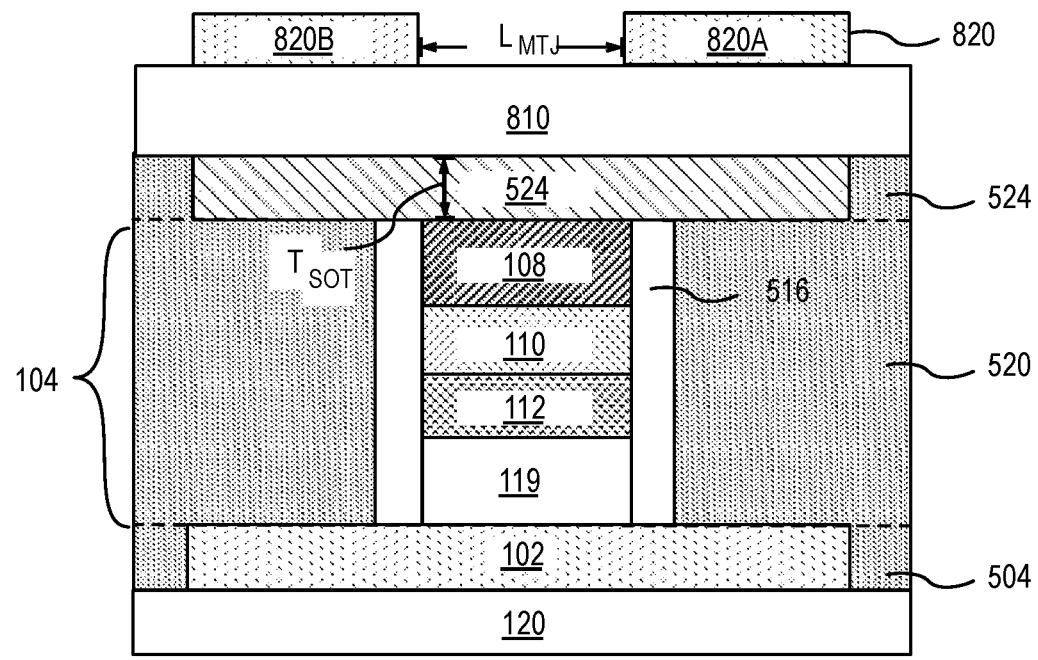
FIG. 8A illustrates a cross-sectional view of the structure in FIG. 7A following the formation of a conductive layer on the spin orbit coupling structure and following the formation of a mask on the conductive layer to pattern the conductive layer.

FIG. 8A illustrates a cross-sectional view of the structure in FIG. 7A following the formation of a conductive layer 810 on the SOC structure 524 and following the formation of a mask 820 on the conductive layer 810 to pattern the conductive layer 810. In an embodiment, the SOC structure 524 has a thickness, $T_{SOT}$, between 2 nm and 20 nm. In an embodiment, the conductive layer 810 includes a material that is the same or substantially the same as the material of the conductive layers 116B, 118B. The mask 820 includes potions 820A and 820B that are spaced apart by a length substantially equal to the length of the MTJ device, $L_{MTJ}$.

Figure 8B:
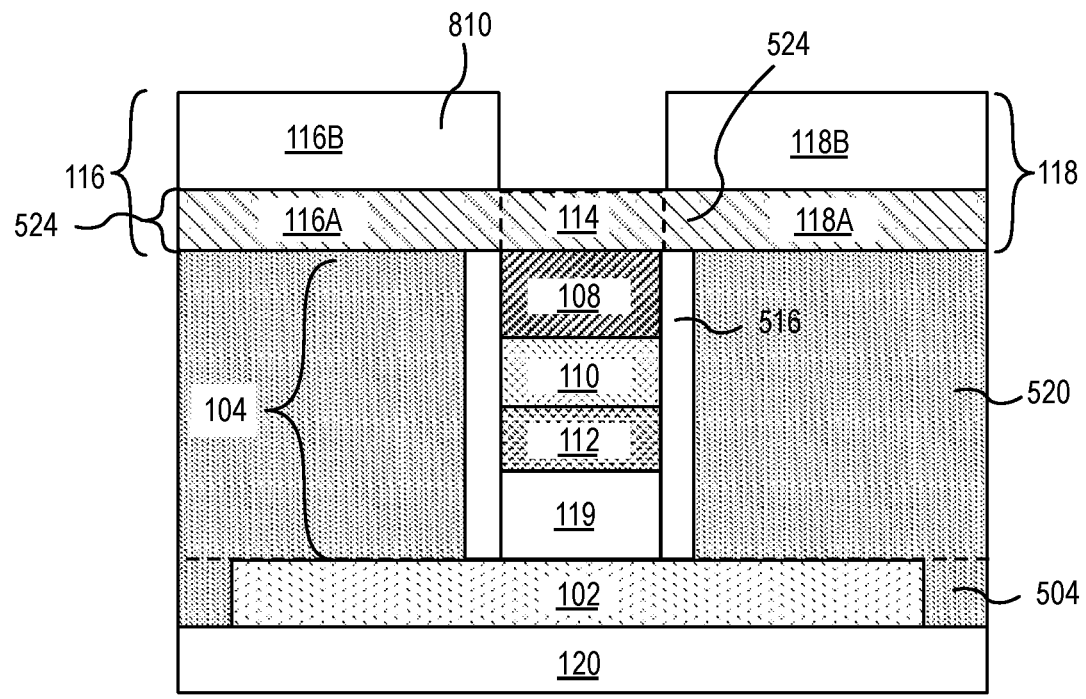
FIG. 8B illustrates a cross-sectional view of the structure in FIG. 8A following the process of etching the conductive layer to form interconnect line segments.

FIG. 8B illustrates a cross-sectional view of the structure in FIG. 8A following the process of etching the conductive layer to form interconnect line segments 116 and 118. In an embodiment, a plasma etch process is utilized to conductive layer 810 to form conductive layers 116B and 118B. In the illustrative embodiment, the SOC structure 524 is not recessed during etching of the conductive layer 810. In some embodiments, portion of the SOC structure 524 above the MTJ device 104 may be recessed.

Collectively, the portion of the SOC structure 524 under the conductive layers 116B and 118B are referred to as the interconnect line segments 116 and 118, respectively. The portion of the SOC structure 524 directly above the MTJ device 104 is referred to as the electrode 114.

Figure 9:
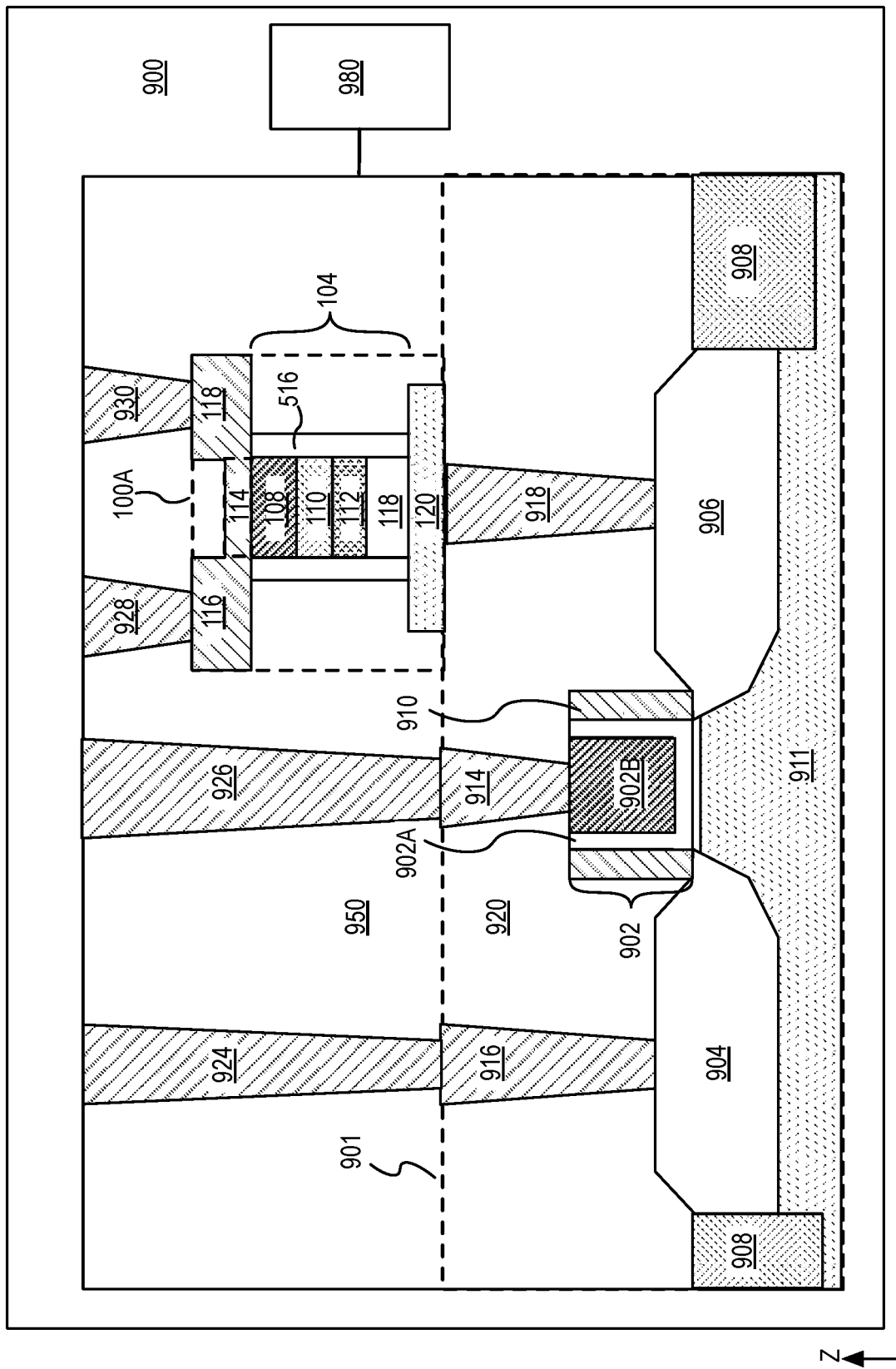
FIG. 9 illustrates a cross-sectional view of an SOT memory device coupled with a transistor.

FIG. 9 illustrates a system 900 including a power supply 980 connected to a memory device 100A coupled to a transistor 901. In an embodiment, the memory device 100A includes an MTJ device 104 on an electrode 102, described in association with FIGS. 1A-1D. The memory device 100A may include one or more features of the memory device 100A described above in embodiments, associated with FIGS. 1A-1G.

In an embodiment, the transistor 901 has a source region 904, a drain region 906 and a gate 902. The transistor 901 further includes a gate contact 914 above and electrically coupled to the gate 902, a source contact 916 above and electrically coupled to the source region 904, and a drain contact 918 above and electrically coupled to the drain region 906 as is illustrated in FIG. 9. In the illustrative embodiment, the SOT memory device 100A includes a magnetic tunnel junction (MTJ) device 104 coupled with a first electrode 102, where the MTJ device includes a free magnet 108, a tunnel barrier 110 and a fixed magnet 112. In some embodiments, such as in the illustrative embodiment, the magnetic tunnel junction (MTJ) device 104 is a perpendicular MTJ (pMTJ) device 104. A second electrode 114 is coupled with the free magnet 108 and coupled between a pair of interconnect line segments 116 and 118. The electrode 114 and the interconnect line segments 116 and 118 include a spin orbit torque material. The memory device 100A is electrically coupled with the drain contact 918 of transistor 901 through the electrode 102. In an embodiment, the interconnect line segments 116 and 118 are coupled with conductive metallization structures 928 and 930, respectively. A voltage bias applied between metallization structures 928 and 930, produces a spin diffusion current in the electrode 114.

In an embodiment, the underlying substrate 911 represents a surface used to manufacture integrated circuits. Suitable substrate 911 includes a material such as single crystal silicon, polycrystalline silicon and silicon on insulator (SOI), as well as substrates formed of other semiconductor materials. In some embodiments, the substrate 911 is the same as or substantially the same as the substrate 126. The substrate 911 may also include semiconductor materials, metals, dielectrics, dopants, and other materials commonly found in semiconductor substrates.

In an embodiment, the access transistor 901 associated with substrate 911 are metal-oxide-semiconductor field-effect transistors (MOSFET or simply MOS transistors), fabricated on the substrate 911. In various implementations of the invention, the access transistor 901 may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors.

In an embodiment, the access transistor 901 of substrate 911 includes a gate 902. In some embodiments, gate 902 includes at least two layers, a gate dielectric layer 902A and a gate electrode 902B. The gate dielectric layer 902A may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 902A to improve its quality when a high-k material is used.

The gate electrode 902B of the access transistor 901 of substrate 911 is formed on the gate dielectric layer 902A and may consist of at least one P-type work function metal or N-type work function metal, depending on whether the transistor is to be a PMOS or an NMOS transistor. In some implementations, the gate electrode 902B may consist of a stack of two or more metal layers, where one or more metal layers are work function metal layers and at least one metal layer is a conductive fill layer.

For a PMOS transistor, metals that may be used for the gate electrode 902B include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode 902B may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode 902B may consist of one or more U-shaped metal layers formed atop one or more planar, non-U-shaped layers.

In some implementations of the invention, a pair of sidewall spacers 910 are on opposing sides of the gate 902 that bracket the gate stack. The sidewall spacers 910 may be formed from a material such as silicon nitride, silicon oxide, silicon carbide, silicon nitride doped with carbon, and silicon oxynitride. Processes for forming sidewall spacers include deposition and etching process operations. In an alternate implementation, a plurality of spacer pairs may be used, for instance, two pairs, three pairs, or four pairs of sidewall spacers may be formed on opposing sides of the gate stack. As is well known in the art, source region 904 and drain region 906 are formed within the substrate adjacent to the gate stack of each MOS transistor. The source region 904 and drain region 906 are generally formed using either an implantation/diffusion process or an etching/deposition process. In the former process, dopants such as boron, aluminum, antimony, phosphorous, or arsenic may be ion-implanted into the substrate to form the source region 904 and drain region 906. An annealing process that activates the dopants and causes them to diffuse further into the substrate typically follows the ion implantation process. In the latter process, the substrate 911 may first be etched to form recesses at the locations of the source and drain regions. An epitaxial deposition process may then be carried out to fill the recesses with material that is used to fabricate the source region 904 and drain region 906. In some implementations, the source region 904 and drain region 906 may be fabricated using a silicon alloy such as silicon germanium or silicon carbide. In some implementations, the epitaxially deposited silicon alloy may be doped in situ with dopants such as boron, arsenic, or phosphorous. In further embodiments, the source region 904 and drain region 906 may be formed using one or more alternate semiconductor materials such as germanium or a group III-V material or alloy. And in further embodiments, one or more layers of metal and/or metal alloys may be used to form the source region 904 and drain region 906. In the illustrative embodiment, an isolation 908 is adjacent to the source region 904, drain region 906 and portions of the substrate 911.

In an embodiment, a dielectric layer 920 is adjacent to the source contact 916, the drain contact 918 and the gate contact 914. In the illustrative embodiment, a source metallization structure 924 is coupled with the source contact 916 and a gate metallization structure 926 is coupled with the gate contact 914. In the illustrated embodiment, a dielectric layer 950 is adjacent to the gate metallization structure 926, source metallization structure 924, memory device 100A and conductive metallization structures 928 and 930.

In an embodiment, the source contact 916, the drain contact 918 and gate contact 914 each include a multi-layer stack. In an embodiment, the multi-layer stack includes two or more distinct layers of metal such as a layer of Ti, Ru or Al and a conductive cap on the layer of metal. The conductive cap may include a material such as W or Cu.

The isolation 908 and dielectric layers 920 and 950 may include any material that has sufficient dielectric strength to provide electrical isolation such as, but not, limited silicon dioxide, silicon nitride, silicon oxynitride, carbon doped nitride and carbon doped oxide.

Figure 10:
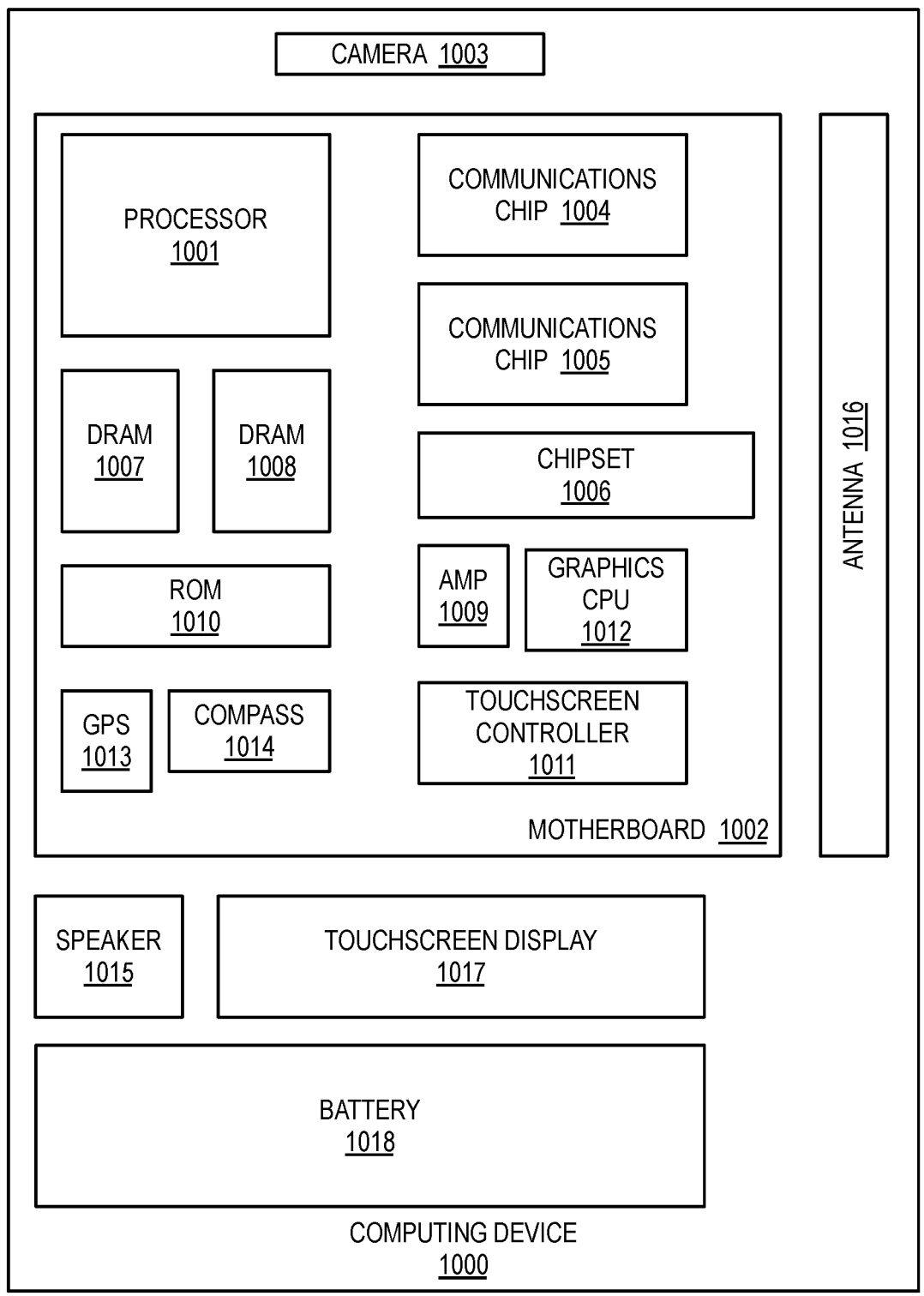
FIG. 10 illustrates a computing device in accordance with embodiments of the present disclosure.

FIG. 10 illustrates a computing device 1000 in accordance with embodiments of the present disclosure. As shown, computing device 1000 houses a motherboard 1002. Motherboard 1002 may include a number of components, including but not limited to a processor 1001 and at least one communications chip 1005. Processor 1001 is physically and electrically coupled to the motherboard 1002. In some implementations, communications chip 1005 is also physically and electrically coupled to motherboard 1002. In further implementations, communications chip 1005 is part of processor 1001.

Depending on its applications, computing device 1000 may include other components that may or may not be physically and electrically coupled to motherboard 1002. These other components include, but are not limited to, volatile memory (e.g., DRAM), non-volatile memory (e.g., ROM), flash memory, a graphics processor, a digital signal processor, a crypto processor, a chipset 1006, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 1005 enables wireless communications for the transfer of data to and from computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 1005 may implement any of a number of wireless standards or protocols, including but not limited to Wi-Fi (IEEE 802.6 family), WiMAX (IEEE 802.6 family), IEEE 802.10, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1000 may include a plurality of communications chips 1004 and 1005. For instance, a first communications chip 1005 may be dedicated to shorter range wireless communications such as Wi-Fi and Bluetooth and a second communications chip 1004 may be dedicated to longer range wireless communications such as GPS, EDGE, GPRS, CDMA, WiMAX, LTE, Ev-DO, and others.

Processor 1001 of the computing device 1000 includes an integrated circuit die packaged within processor 1001. In some embodiments, the integrated circuit die of processor 1001 includes one or more memory devices, such as SOT memory devices 100A and 100B, described in association with FIGS. 1A, 1B, 1C and 1D, in accordance with embodiments of the present disclosure. The term "processor" may refer to any device or portion of a device that processes electronic data from registers and/or memory to transform that electronic data into other electronic data that may be stored in registers and/or memory.

Communications chip 1005 also includes an integrated circuit die packaged within communications chip 1005. In another embodiment, the integrated circuit die of communications chips 1004, 1005 include a memory array with memory cells including at least one memory device such as a memory device 100 including an MTJ device 104 on an electrode 102.

In various examples, one or more communications chips 1004, 1005 may also be physically and/or electrically coupled to the motherboard 1002. In further implementations, communications chips 1004 may be part of processor 1001. Depending on its applications, computing device 1000 may include other components that may or may not be physically and electrically coupled to motherboard 1002. These other components may include, but are not limited to, volatile memory (e.g., DRAM) 1007, 1008, non-volatile memory (e.g., ROM) 1010, a graphics CPU 1012, flash memory, global positioning system (GPS) device 1013, compass 1014, a chipset 1006, an antenna 1016, a power amplifier 1009, a touchscreen controller 1011, a touchscreen display 1017, a speaker 1015, a camera 1003, and a battery 1018, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 1000 and discussed above may contain a stand-alone integrated circuit memory die that includes one or more arrays of memory cells including one or more memory devices, such as a memory device 100, including an MTJ device 104 on an electrode 102, built in accordance with embodiments of the present disclosure.

In various implementations, the computing device 1000 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Figure 11:
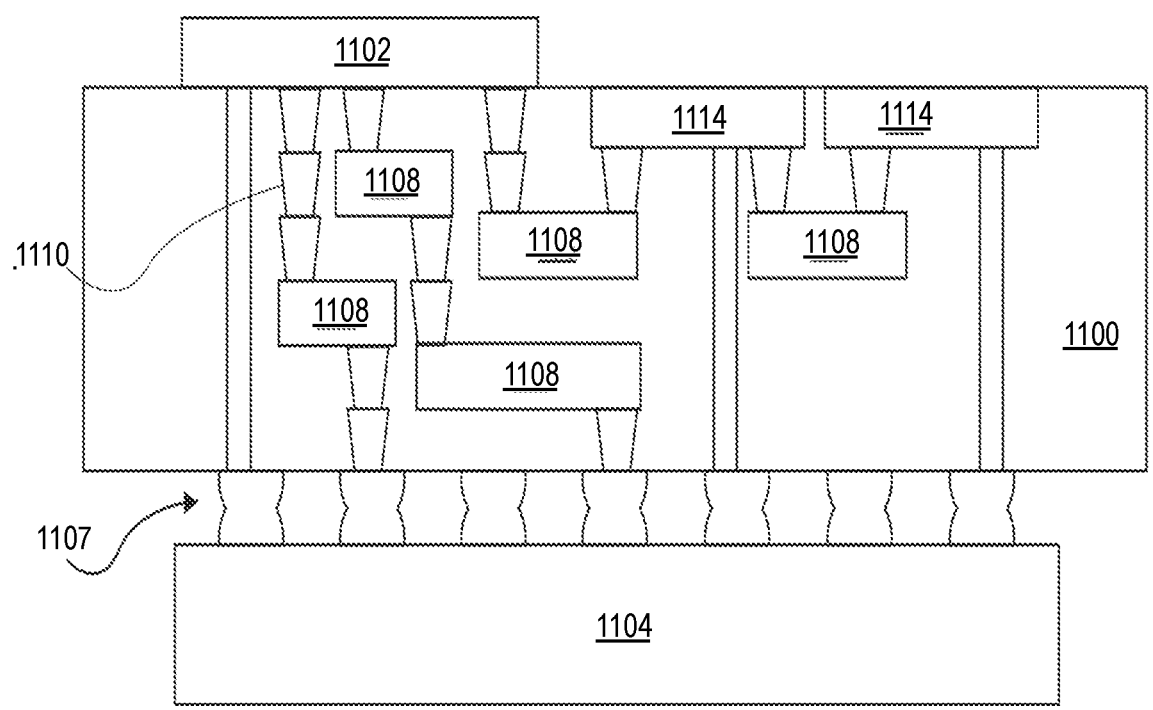
FIG. 11 illustrates an integrated circuit (IC) structure that includes one or more embodiments of the present disclosure.

FIG. 11 illustrates an integrated circuit (IC) structure 1100 that includes one or more embodiments of the disclosure. The integrated circuit (IC) structure 1100 is an intervening substrate used to bridge a first substrate 1102 to a second substrate 1104. The first substrate 1102 may be, for instance, an integrated circuit die. The second substrate 1104 may be, for instance, a memory module, a computer mother, or another integrated circuit die. Generally, the purpose of an integrated circuit (IC) structure 1100 is to spread a connection to a wider pitch or to reroute a connection to a different connection. For example, an integrated circuit (IC) structure 1100 may couple an integrated circuit die to a ball grid array (BGA) 1107 that can subsequently be coupled to the second substrate 1104. In some embodiments, the first and second substrates 1102/1104 are attached to opposing sides of the integrated circuit (IC) structure 1100. In other embodiments, the first and second substrates 1102/1104 are attached to the same side of the integrated circuit (IC) structure 1100. And in further embodiments, three or more substrates are interconnected by way of the integrated circuit (IC) structure 1100.

The integrated circuit (IC) structure 1100 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials. The integrated circuit (IC) structure may include metal interconnects 1108 and vias 1110, including but not limited to through-silicon vias (TSVs) 1110. The integrated circuit (IC) structure 1100 may further include embedded devices 1114, including both passive and active devices. Such devices include, but are not limited to, capacitors, decoupling capacitors, resistors, inductors, fuses, diodes, transformers, device structure including transistors, such as a transistor 901 (described in association with FIG. 9, not shown in FIG. 11) coupled with a with one at least one memory device such as the memory device 100A which includes interconnect line segments 116, 118, and electrode 114 coupled with the MTJ device 104. The integrated circuit (IC) structure 1100 may further include embedded devices 1114 such as one or more resistive random-access devices, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 1100. In accordance with embodiments of the present disclosure, apparatuses or processes disclosed herein may be used in the fabrication of integrated circuit (IC) structure 1100.

Accordingly, one or more embodiments of the present disclosure relate generally to the fabrication of embedded microelectronic memory. The microelectronic memory may be non-volatile, wherein the memory can retain stored information even when not powered. One or more embodiments of the present disclosure relate to the fabrication of a memory device such as the SOT memory devices 100A and 100B. The SOT memory devices 100A and 100B may be used in an embedded non-volatile memory applications.

In particular, the present disclosure includes descriptions of spin orbit torque memory devices and methods to form the same.

Specific embodiments are described herein with respect to perpendicular spin orbit torque devices. It is to be appreciated that embodiments described herein may also be applicable to other non-volatile memory devices. Such non-volatile memory devices may include, but are not limited to, magnetic random-access memory (MRAM) devices, spin torque transfer memory (STTM) devices such as in-plane STTM or perpendicular STTM devices.

What is claimed is:

1. A spin orbit torque (SOT) device, comprising:
a tunnel barrier between a free magnet and a fixed magnet;
a first electrode coupled with the fixed magnet; and
a second electrode coupled with the free magnet and directly coupled between a pair of interconnect line segments, wherein:
the second electrode and the pair of interconnect line segments each comprise a spin orbit torque material; and
a conductive path has a cross-section within the second electrode that is smaller than a cross-section within at least one of the interconnect line segments.

2. The SOT device of claim 1, wherein the cross-section of the conductive path within the second electrode is smaller than a cross-section within either of the pair of interconnect line segments.

3. The SOT device of claim 1, wherein the second electrode has a first thickness that is less than a second thickness of at least one of the interconnect line segments.

4. The SOT device of claim 3, wherein the second electrode comprises the first thickness of the spin orbit coupling material, and at least one of the interconnect line segments comprises a second thickness of the spin orbit coupling material.

5. The SOT device of claim 4, wherein a bottom of the second electrode and a bottom of the interconnect line segments are co-planar if the free magnet is below the second electrode, and a top of the second electrode and a top of the interconnect line segments are co-planar if the free magnet is above the second electrode.

6. The SOT device of claim 3 wherein at least one of the interconnect line segments comprises the first thickness of the spin orbit coupling material, and a second material on the spin orbit coupling material.

7. The SOT device of claim 6, wherein the second material is on top of the spin orbit coupling material if the free magnet is below the second electrode, and is below the spin orbit torque material if the free magnet is above the second electrode.

8. The SOT device of claim 3, wherein both the second electrode and at least one of the interconnect line segments comprise a first width of the spin orbit coupling material.

9. The SOT device of claim 1, wherein at least a portion of the second electrode has a first width, and at least one of the interconnect line segments has a second width, greater than the first width.

10. The SOT device of claim 1, wherein the second electrode separates the pair of interconnect line segments by a distance at least equal to a diameter or a length of the free magnet.

11. The SOT device of claim 10, wherein the distance is not more than 20% greater than the diameter or the length of the free magnet.

12. The SOT device of claim 1, wherein at least one of the pair of interconnect lines segments has a length at least equal to a diameter or a length of the free magnet.

13. An apparatus, comprising:
a transistor above a substrate, the transistor comprising:
a drain contact coupled to a drain;
a source contact coupled to a source; and
a gate contact coupled to a gate;
a spin orbit torque (SOT) device coupled with the drain contact, the SOT device comprising:
a free magnet;
a fixed magnet;
a tunnel barrier between the free magnet and the fixed magnet;
a first electrode coupled with the fixed magnet; and
a second electrode coupled with the free magnet and coupled between a first interconnect line segment and a second interconnect line segment, wherein:
the second electrode, the first interconnect line segment, and the second interconnect line segment comprise a spin orbit torque material; and
a cross-section of a conductive path in the second electrode is smaller than a cross-section of a conductive path in at least one of the first or the second interconnect line segments;
a first contact over and coupled with the first interconnect line segment; and
a second contact over and coupled with a second interconnect line segment.

14. The apparatus of claim 13, wherein the apparatus is coupled to a power supply.

* * * * *